(12) United States Patent
Kawamura

(10) Patent No.: US 6,288,936 B1
(45) Date of Patent: Sep. 11, 2001

(54) NONVOLATILE MEMORY FOR STORING MULTIVALUE DATA

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/734,233

(22) Filed: Dec. 12, 2000

(30) Foreign Application Priority Data

Jun. 30, 2000 (JP) .................................................. 12-199601

(51) Int. Cl.[7] .................................................. G11C 16/04
(52) U.S. Cl. .................................. 365/185.03; 365/185.24; 365/185.28; 365/185.05
(58) Field of Search ........................ 365/185.03, 185.24, 365/185.28, 185.05, 185.01, 185.21, 185.22, 185.18

(56) References Cited

U.S. PATENT DOCUMENTS 6,067,248 * 5/2000 Yoo .................................. 365/185.03

FOREIGN PATENT DOCUMENTS

404184794A * 7/1992 (JP) ................................ G11C/16/04

* cited by examiner

Primary Examiner—David Nelms
Assistant Examiner—David Lam
(74) Attorney, Agent, or Firm—Arent Fox Kintner Plotkin & Kahn, PLLC

(57) ABSTRACT

A nonvolatile memory that has a plurality of floating gate type cell transistors comprises a read buffer circuit, connected to the bit line, that detects the threshold voltage states in the cell transistor. Each cell transistor can hold $2^N$ threshold voltage states and accordingly, the read buffer circuit reads N bits of data. For this purpose, the read buffer circuit has a latch circuit that latches the read data in accordance with the detected threshold voltage state. This latch circuit has a first and second latch reversal circuit for reversing the latched state to the first or second state. When the read buffer circuit reads the first bit being held in the cell transistor, the latch circuit in its initial state is reversed or not reversed by the first latch reversal circuit in accordance with the detected first and second threshold voltage state, or third and fourth threshold voltage state, and that latch state is output as the first data. Furthermore, when the lower order second bit held in the cell transistor is read next, the read buffer circuit is reversed or not reversed from the latch state corresponding to the first data above by the first latch reversal circuit in accordance with the detected first or second threshold voltage state. Then, it is reversed or not reversed by the second latch reversal circuit in accordance with the detected third or fourth threshold voltage state and the latch state is output as the second data.

11 Claims, 18 Drawing Sheets

FIG. 6

Read Operation

| Stored Data | | WL | | SET1, 2 | | Latch State | | Read Data | |
|---|---|---|---|---|---|---|---|---|---|
| Q2 | Q1 | 1st cycle | 2nd cycle | 1st cycle | 2nd cycle | 1st cycle | 2nd cycle | 1st cycle | 2nd cycle |
| 0 | 1 | WL=V2 | WL=V1 | SET1=High | SET1=High | A_0=High, B_0=Low | A_0=High, B_0=Low | Q2=0 | |
| | | | WL=V3 | | SET2=High | | A_0=Low, B_0=High | | Q1=1 |
| 0 | 0 | WL=V2 | WL=V1 | SET1=High | SET1=High | A_0=High, B_0=Low | A_0=High, B_0=Low | Q2=0 | |
| | | | WL=V3 | | SET2=High | | A_0=High, B_0=Low | | Q1=0 |
| 1 | 0 | WL=V2 | WL=V1 | SET1=High | SET1=High | A_0=Low, B_0=High | A_0=High, B_0=Low | Q2=1 | |
| | | | WL=V3 | | SET2=High | | A_0=High, B_0=Low | | Q1=0 |
| 1 | 1 | WL=V2 | WL=V1 | SET1=High | SET1=High | A_0=Low, B_0=High | A_0=Low, B_0=High | Q2=1 | |
| | | | WL=V3 | | SET2=High | | A_0=Low, B_0=High | | Q1=1 |

Program Intput Circuit
FIG. 11A
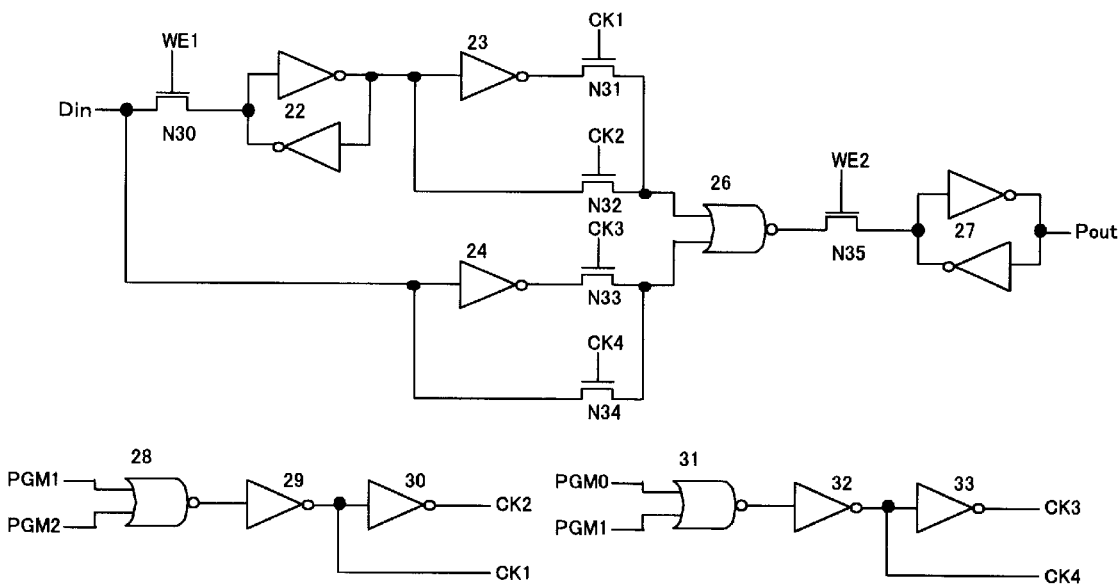
FIG. 11B
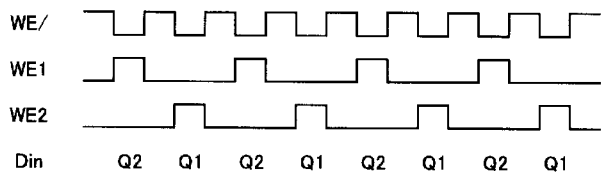
FIG. 11C
|  | PGM0 | PGM1 | PGM2 |
|---|---|---|---|
| CK1 | L | H | H |
| CK2 | H | L | L |
| CK3 | L | L | H |
| CK4 | H | H | L |
FIG. 11D
PGM0 = High
| Column | 0 | 1 | 2 | 3 |
|---|---|---|---|---|
| Q2 | 0 | 0 | 1 | 1 |
| Q1 | 1 | 0 | 0 | 1 |
| L1 data | 1 | 1 | 0 | 1 |
PGM1 = High
| Column | 0 | 1 | 2 | 3 |
|---|---|---|---|---|
| Q2 | 0 | 0 | 1 | 1 |
| Q1 | 1 | 0 | 0 | 1 |
| L2 data | 1 | 0 | 1 | 1 |
PGM2 = High
| Column | 0 | 1 | 2 | 3 |
|---|---|---|---|---|
| Q2 | 0 | 0 | 1 | 1 |
| Q1 | 1 | 0 | 0 | 1 |
| L3 data | 0 | 1 | 1 | 1 |

FIG. 15A
Program Input Circuit
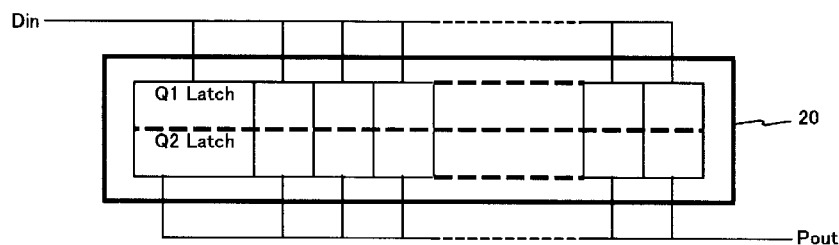
FIG. 15B
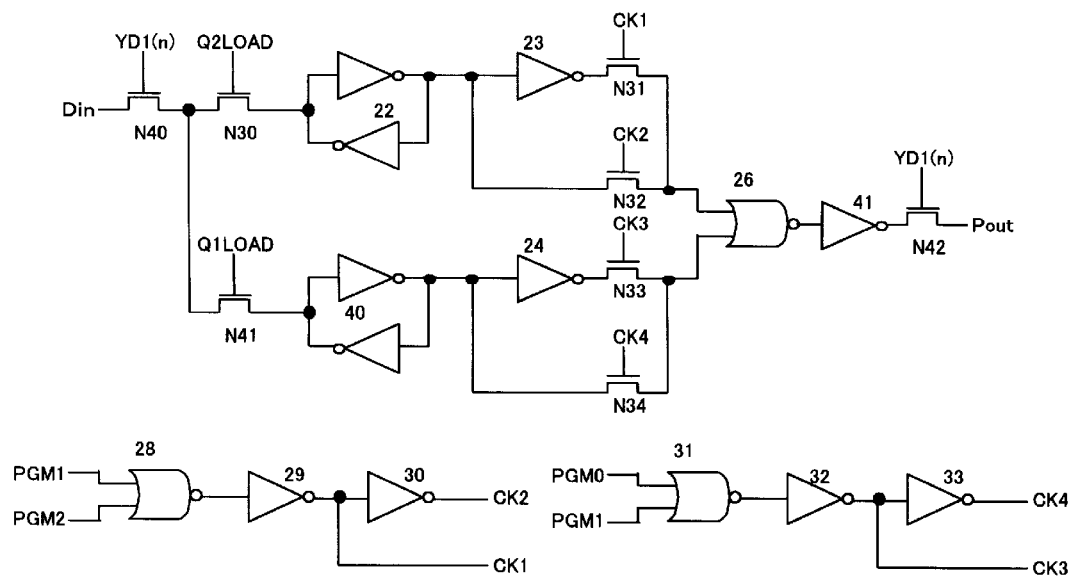
FIG. 15C
|  | PGM0 | PGM1 | PGM2 |
|---|---|---|---|
| CK1 | L | H | H |
| CK2 | H | L | L |
| CK3 | H | H | L |
| CK4 | L | L | H |

NONVOLATILE MEMORY FOR STORING MULTIVALUE DATA

BACKGROUND OF THE INVENTION

1. Field of the Invention

The present invention relates to a nonvolatile memory for storing multivalue data, and more particularly to a semiconductor nonvolatile memory with a read buffer circuit that can read multivalue data stored in memory cells using a simple configuration.

2. Description of the Related Art

Semiconductor nonvolatile memory, such as flash memory, consists of cell transistors having floating gates in the channel area that lies between the source and drain areas. Injection of an electrical charge into these floating gates causes a change in the threshold voltage of the cell transistors and thus records data. The recorded data is read using the difference between the threshold values of the cell transistors.

In a conventional nonvolatile memory, one-bit data is recorded using the state in which electrical charges are not accumulated in the floating gates (state in which the threshold voltage is low when the charge is an electron) and the state in which electrical charges are accumulated (state in which the threshold voltage is high when the charge is an electron). The state in which electrons are not accumulated in the floating gates is a state of data 1 recorded or a deleted state. Accumulation of electrons in the floating gates indicates a state in which data 0 has been recorded or a programming state.

Because semiconductor nonvolatile memory, such as flash memory, is small and stores data even when the power is turned off, it is widely used as an image and audio recording medium in equipment such as digital cameras. Greater storage capacity is being demanded but, as described above, in a conventional nonvolatile memory for normal use a cell transistor can only store one-bit (single value) data.

For this reason, the recording of multivalue data, such as 2 bits data, in cell transistors is being proposed. By controlling the electrical charge injected into floating gates, a plurality of threshold voltage states is achieved and multi-value data can be recorded. For example, when 4 value data (2 bits) is stored four threshold voltage states will be stored.

However, to read 2 bits data from a cell transistor, it is necessary to read the first bit of data and then read the second bit of data. Accordingly, a latch circuit that temporarily holds the two bits of data is required in the read buffer circuit for reading data recorded in the cell transistor.

Generally, a read buffer circuit is installed for each bit line and so it is necessary to simplify the read buffer circuit configuration as much as possible. However, as described above, with the plurality of data values stored in a cell transistor, when a plurality of latch circuits is installed in a read buffer circuit, the scale of the read buffer circuit increases and, from the point of view of integration, goes against the demand for greater capacity.

Furthermore, when programming (writing) multivalue cell transistors, a plurality of bits must be input and an electrical charge that corresponds to these bits must be injected into the floating gates. Here, it is preferable that the programming operation corresponding to the relationship between the plurality of bits and the multiple values is realized using a simple program circuit.

SUMMARY OF THE INVENTION

Therefore, an object of the present invention is to provide a read buffer circuit having a relatively simple configuration in nonvolatile memory for recording multivalue data.

A further object of the present invention is to provide a circuit with a simple configuration that enables programming of multivalue data in nonvolatile memory for recording multivalue data.

To achieve the above objects, according to the first aspect of the present invention, a nonvolatile memory that has a plurality of floating gate type cell transistors comprises a read buffer circuit, connected to the bit line, that detects the threshold voltage states in the cell transistor. Each cell transistor can hold $2^N$ threshold voltage states and accordingly, the read buffer circuit reads N bits of data. For this purpose, the read buffer circuit has a latch circuit that latches the read data in accordance with the detected threshold voltage state. This latch circuit has a first and second latch reversal circuit for reversing the latched state to the first or second state.

When the read buffer circuit reads the first bit being held in the cell transistor, the latch circuit in its initial state is reversed or not reversed by the first latch reversal circuit in accordance with the detected first and second threshold voltage state, or third and fourth threshold voltage state, and that latch state is output as the first data. Furthermore, when the lower order second bit held in the cell transistor is read next, the read. buffer circuit is reversed or not reversed from the latch state corresponding to the first data above by the first latch reversal circuit in accordance with the detected first or second threshold voltage state. Then, it is reversed or not reversed by the second latch reversal circuit in accordance with the detected third or fourth threshold voltage state and the latch state is output as the second data.

The above operations enable the read buffer circuit to differentiate between and latch at least two bits of data in the one latch circuit. In other words, after the latch circuit is reset to its initial state, the first data is held then output and the second data is held then output sequentially.

In the second aspect of the present invention, nonvolatile memory having a plurality of floating gate type cell transistors comprises a program input circuit that, in response to the input of the first bit and then the lower order second bit, outputs program data showing whether or not a program exists, and a read buffer circuit, connected to the bit line, for detecting the threshold voltage state of the cell transistors. During the programming, the read buffer circuit latches the above program data and sends the program data to the bit lines. Furthermore, the above program input circuit outputs the above program data in accordance with the combination of the first and second bits in the first cycle which programs from the first state (the deleted state) to second state, in the second cycle which programs from the first to the third state, and in the third cycle which programs from the first to the fourth state.

Provision of the above program input circuit enables program data to be held in the latch circuit within the read buffer circuit in accordance with the two bit combination. Accordingly, the cell transistors can be programmed in accordance with the program data held in the latch circuit.

BRIEF DESCRIPTION OF THE DRAWINGS

FIG. 6 is a table showing signals and node states is during a read operation;

FIGS. 11A–D is a diagram that explains the program input circuit;

FIGS. 15A–C is a diagram for explaining another program input circuit;

DESCRIPTION OF THE PREFERRED EMBODIMENTS

Aspects of the embodiment of the present invention are explained below with reference to figures. However, the embodiment presented here do not limit the technical scope of the present invention.

Figure 1:
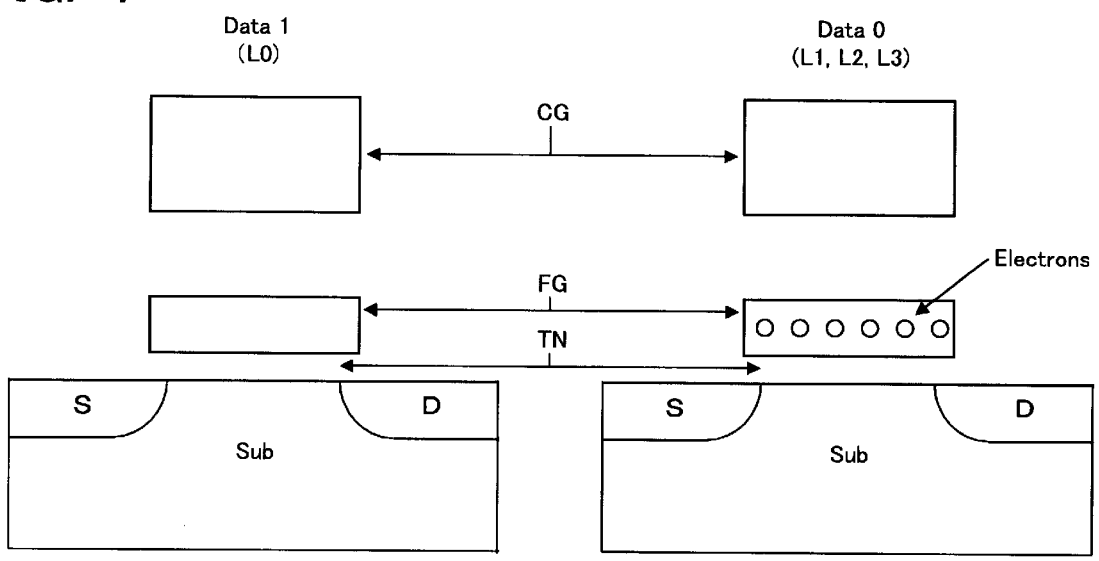
FIG. 1 is a schematic view of a cell transistor in this aspect of the embodiment.

FIG. 1 is a schematic view of a cell transistor in an aspect of the embodiment. In both the right and left cross-sectional figures, N-type source and drain areas S and D are formed at the surface of the P-type semiconductor substrate Sub. A floating gate FG is formed via a tunnel oxide film TN on the channel area between the source and drain areas S and D, and a control gate CG is further provided with the insulation film interposed. Electrons have not been injected into the floating gate of the cell transistor on the left. This is the state where data 1 is stored, in conventional memory for recording one bit. Electrons have been injected into the floating gate of the cell transistor on the right. This is the state where data 0 is stored in the conventional memory.

In this aspect of the embodiment of the present invention, the cell transistor can store two bits of data. Therefore, the cell transistor can hold state L0 in which electrons are not accumulated in the floating gate and states L1, L2, and L3 in which electrons are accumulated with the number of electrons gradually increasing.

Figure 2:
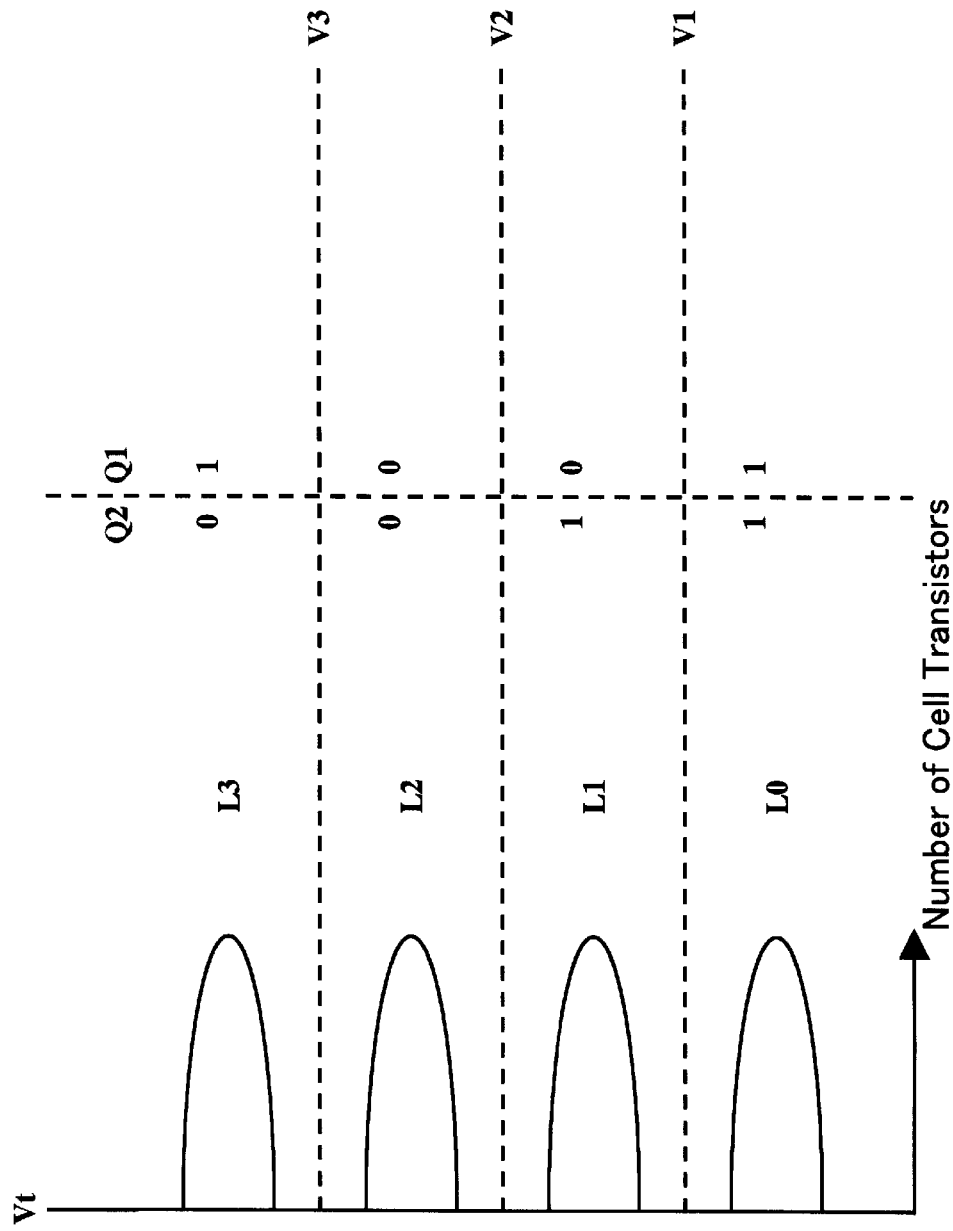
FIG. 2 is a diagram showing the relationship between the two-bit data Q1 and Q2 and the distribution of the cell transistor threshold voltage Vt.

FIG. 2 shows the relationship between the two bits of data Q1 and Q2 and the distribution of the cell transistor threshold voltage Vt. In the figure, the vertical axis shows the threshold voltage Vt, with the threshold voltage increasing as the axis gets higher. The horizontal axis shows the number of cell transistors. In the figure, four distributions are shown that correspond with the four states L0, L1, L2, and L3 of the threshold voltage level. In other words, state L0 is the state in which the threshold voltage is lower than threshold voltage V1, state L1 is the state in which the threshold voltage is between threshold voltages V1 and V2, state L2 is the state in which the threshold voltage is between threshold voltages V2 and V3, and state L3 is the state in which the threshold voltage is higher than threshold voltage V3.

As described above, there are three levels (L1, L2, L3) in the state in which electrons are injected into the floating gate of the memory cell and these levels change depending on the amount of electrons in the floating gates. At this time, the threshold voltage Vt in the memory cells is positive and the memory cell functions as an enhancement transistor. In contrast, there is another state (L0) in which the electrons are withdrawn from the floating gates of the memory cells. At this time the Vt is negative and the memory cells function as depletion transistors. In this aspect of the embodiment, for example, V1=0 V, V2=0.8 V, and V3=1.6 V.

Two bits of data, Q1 and Q2, are each allocated to states L0 to L3. In the example shown in FIG. 2, the data for state L0 is "11", for state L1 is "10", for state L2 is "00" (or "01"), and for state L3 is "01" (or "00"). Here, the high order bit is defined as Q2 and the low order bit as Q1.

When a memory cell holds the above four states, the high order bit Q2 can be read by applying a voltage V2 to the control gate CG and detecting whether or not the memory cell becomes conductive. That is, in states L0 and L1 the memory cell is conductive and the high order bit is read as Q2=1. In states L2 and L3 the memory cell is nonconductive and the high order bit is read as Q2=0. Furthermore, when the high order bit Q2=1, the low order bit Q1 can be read by applying a voltage V1 to the control gate CG and detecting whether or not the memory cell becomes conductive. L1kewise, when the high order bit Q2=0, the low order bit Q1 to be read by applying a voltage V3 to the control gate CG and detecting whether or not the memory cell becomes conductive.

As described above, to detect the four states, voltages V2, V1, and V3 must be applied sequentially to the control gate CG of the memory cell, and the two bits of data, Q1 and Q2, must be detected from the combination of conductive and non-conductive cell transistors. In other words, a minimum of three read operation cycles is required.

Figure 3:
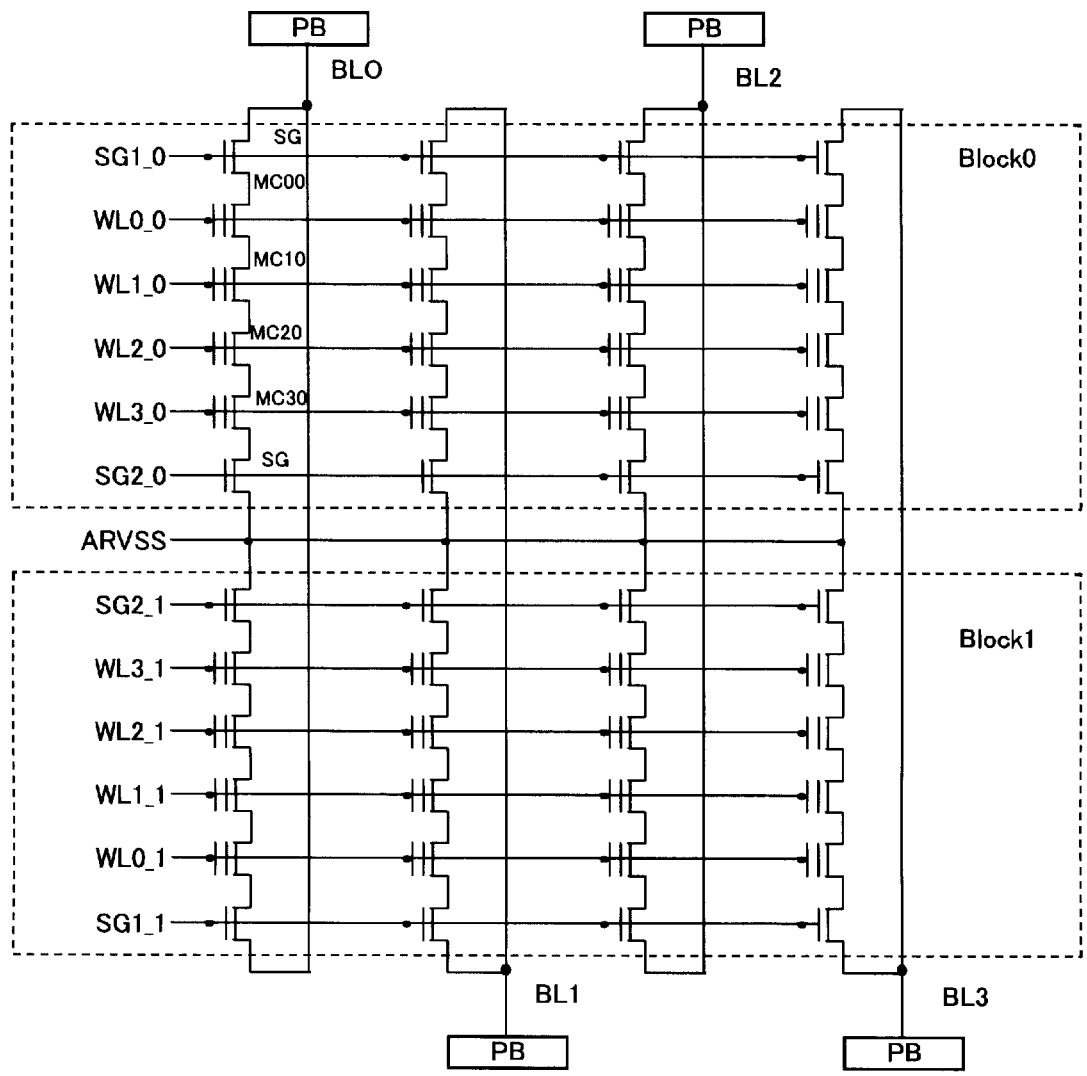
FIG. 3 is a diagram showing the configuration of NAND flash memory and page buffer in this aspect of the embodiment.

FIG. 3 shows the configuration of the page buffer and the NAND-type flash memory array in this aspect of the embodiment. The figures shows four bit lines BL0 through BL3 and the page buffers PB connected to each of these. Furthermore, the strings each of which vertically connects the plurality of memory cells MC and the select gate transistor SG are connected to the bit lines. In the example shown in FIG. 3, the four memory cells MC00 through MC30 are connected to the bit line BL0 and the ground ARVSS via the select gate transistor SG. When the memory cell MCOO is selected, the selector gate signals SG10 and SG20 go to the H level, the selector gate transistors SG become conductive, and the cell string is connected to the bit line BL0 and the ground ARVSS. The word line WL00 is driven by one of the standard voltages V1, V2, or V3 shown in FIG. 2, and the bit line BL0 moves to level L or H depending on the conductivity of the memory cells. This bit line level is detected by the page buffer PB. The page buffer PB is a read buffer circuit and, as will be explained below, comprises a circuit for detecting the bit line level and a latch circuit for holding read data.

Figure 4:
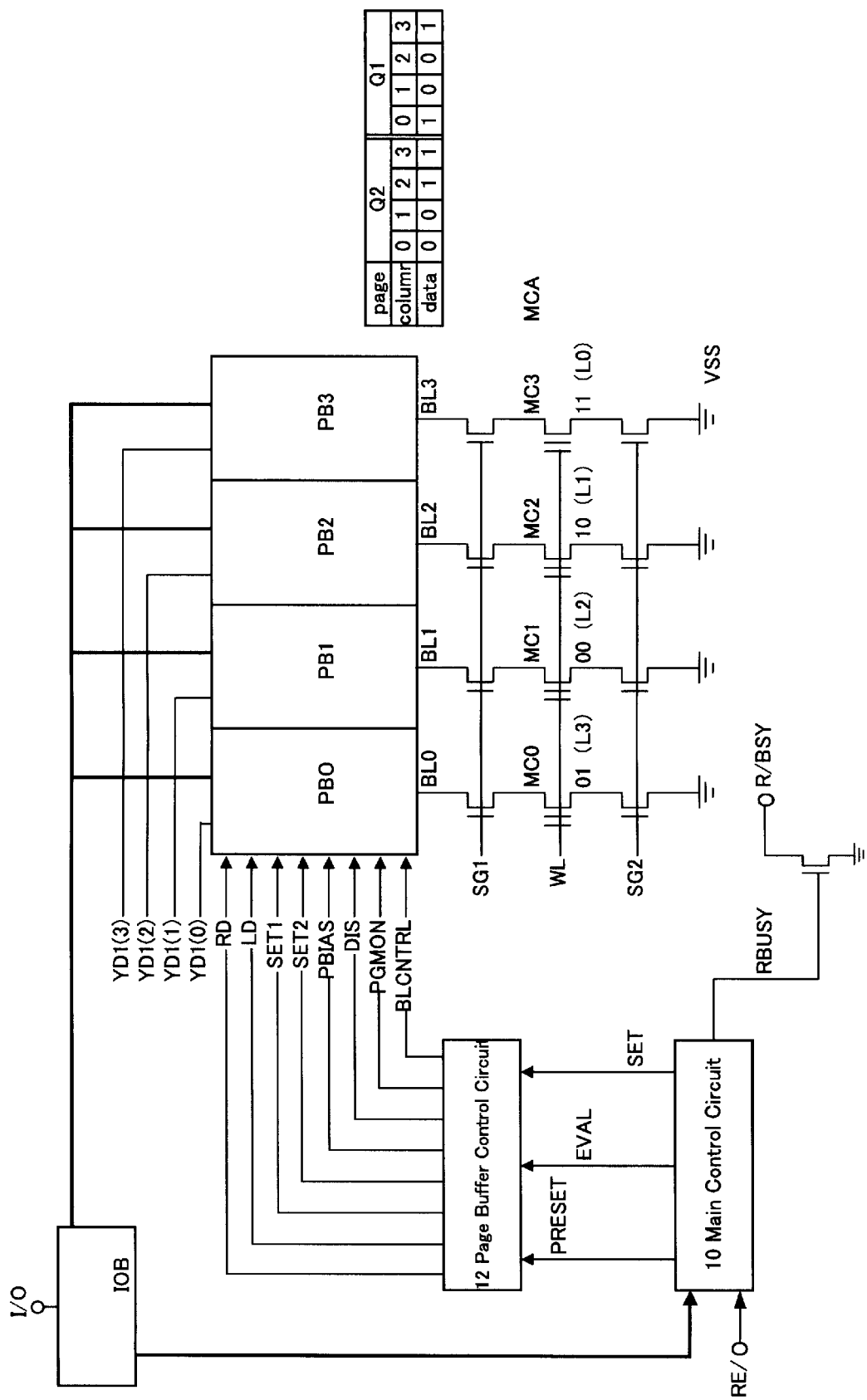
FIG. 4 is a schematic view of the entire flash memory in this aspect of the embodiment.

FIG. 4 is a schematic general view of the flash memory in this aspect of the embodiment. To simplify matters, a one row by four column configuration is used for the memory cell array MCA. Each of the memory cells MC0 through MC3 are connected to the ground VSS and bit lines BL0 through BL3 via the selector transistor. Bit lines BL0 through BL3 are provided with page buffers PB0 through PB3. An external input-output terminal I/O is connected to all four page buffers PB0 through PB3 via an input-output buffer IOB. Through use of page buffer selection signals YD1 (0) through (3), one page buffer is connected to the input-output buffer IOB.

The main control circuit 10 controls the page buffer control circuit 12 and the page buffer control circuit 12 controls the page buffer PB. FIG. 4 is a schematic view that explains the read operation and that shows the control signals required for reading data.

As shown in the table on the right of FIG. 4, memory cell MC0 is in state L3 (Q2, Q1=0, 1), memory cell MC1 is in state L2 (Q2, Q1=0, 0), memory cell MC2 is in state L1 (Q2, Q1=1, 0), and memory cell MC3 is in state L0 (Q2, Q1=1, 1). Because each memory cell holds two bits, the memory cell array MCA physically consists of one row and four columns but logically of two rows and four columns. Here, the high order bit Q2 can be regarded as page 0 data and the low order bit Q1 can be regarded as page 1 data.

Figure 5:
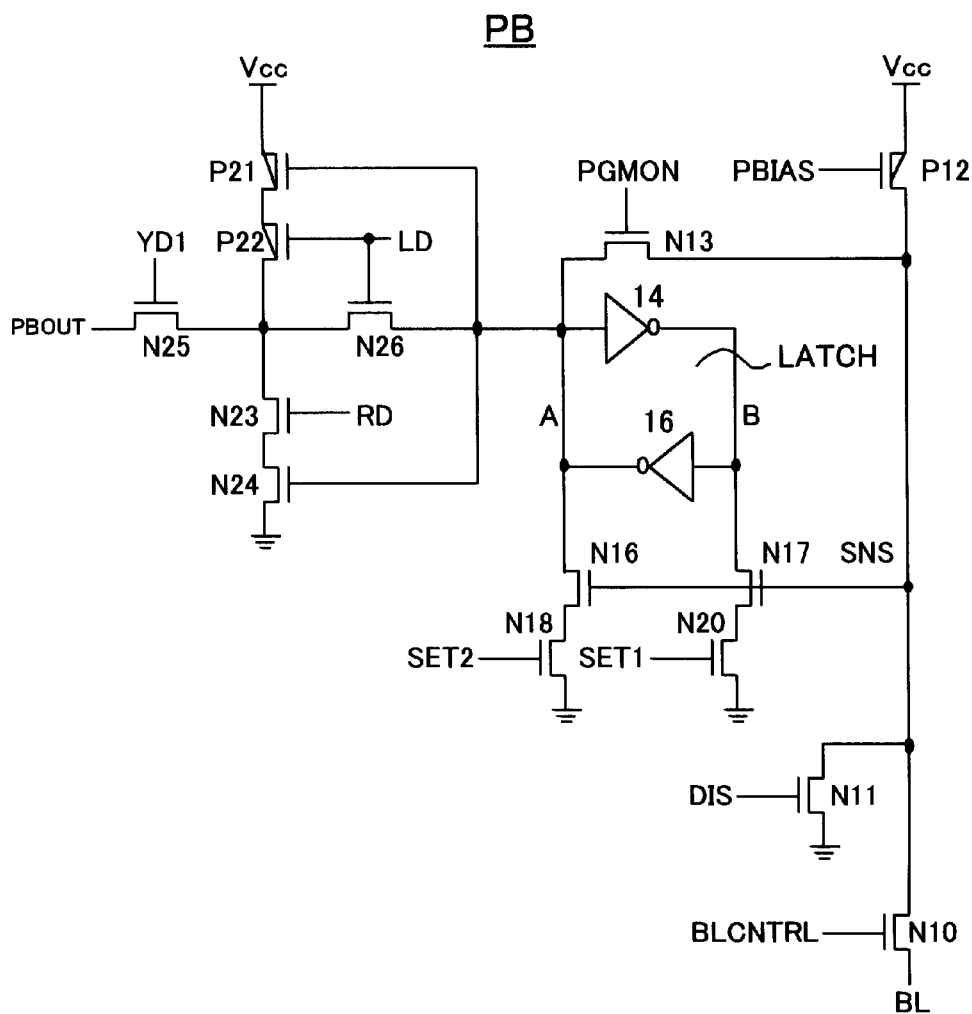
FIG. 5 is a diagram of the read buffer circuit in this aspect of the embodiment.

FIG. 5 is diagram of the read buffer circuit in this aspect of the embodiment. This read buffer circuit is the page buffer PB in FIG. 4. This page buffer PB has a latch circuit LATCH comprising inverters 14 and 16. In addition, the page buffer comprises a P-type transistor P12 that is controlled by a bias control signal PBIAS and an N-type transistor N10 that is controlled by a bit line selection signal BLCNTRL, which constitute sense amps together with memory cells not shown in the diagram that are connected to the bit line BL. That is, by making transistors P12 and N10 conductive and driving the word line of the selected memory cell, the load current from the load transistor P12 will either flow or not flow from the bit line BL into the memory cell depending on whether the memory cell is conductive or not. As a result, the detection node SNS will move to the L or H level.

Transistors N17 and N20 make up the first latch reversal circuit and transistors N16 and N18 make up the second latch reversion circuit. When the detection node SNS of the first latch reversal circuit is on the H level, the first latch reversal circuit, in response to the H level of the first set signal SET1, pulls the node B of the latch circuit LATCH to the L level causing a reversal. On the other hand, when the detection node SNS is on the H level, the second latch reversal circuit, in response to the H level of the second set signal SET2, pulls the node A of the latch circuit to the L level causing a reversal. Accordingly, it is possible to reverse or to not reverse (maintain latched state) a latch circuit using the first or second set signal, depending on the initial latch circuit state and the detection node SNS level.

The page buffer PB has a transistor N13 that is controlled by the program on signal PGMON and a transistor N11 that is controlled by the discharge signal DIS. By making both the transistors conductive, the node A of the latch circuit can be forcibly moved to the L level and the latch circuit can be preset to its initial state. Furthermore, the page buffer PB has a page buffer selection transistor N25 that controls connections to the input-output buffer circuit IOB and this is made conductive by the H level of the page buffer select signal YDI. The page buffer PB is further provided with transistors P21, P22, N23, N24, and N26. When the load signal LD is moved to the H level, program data is supplied from an external source to the latch circuit. Read data that has been read from a memory cell and latched to a latch circuit is output by moving the read signal RD to the H level.

Figure 7:
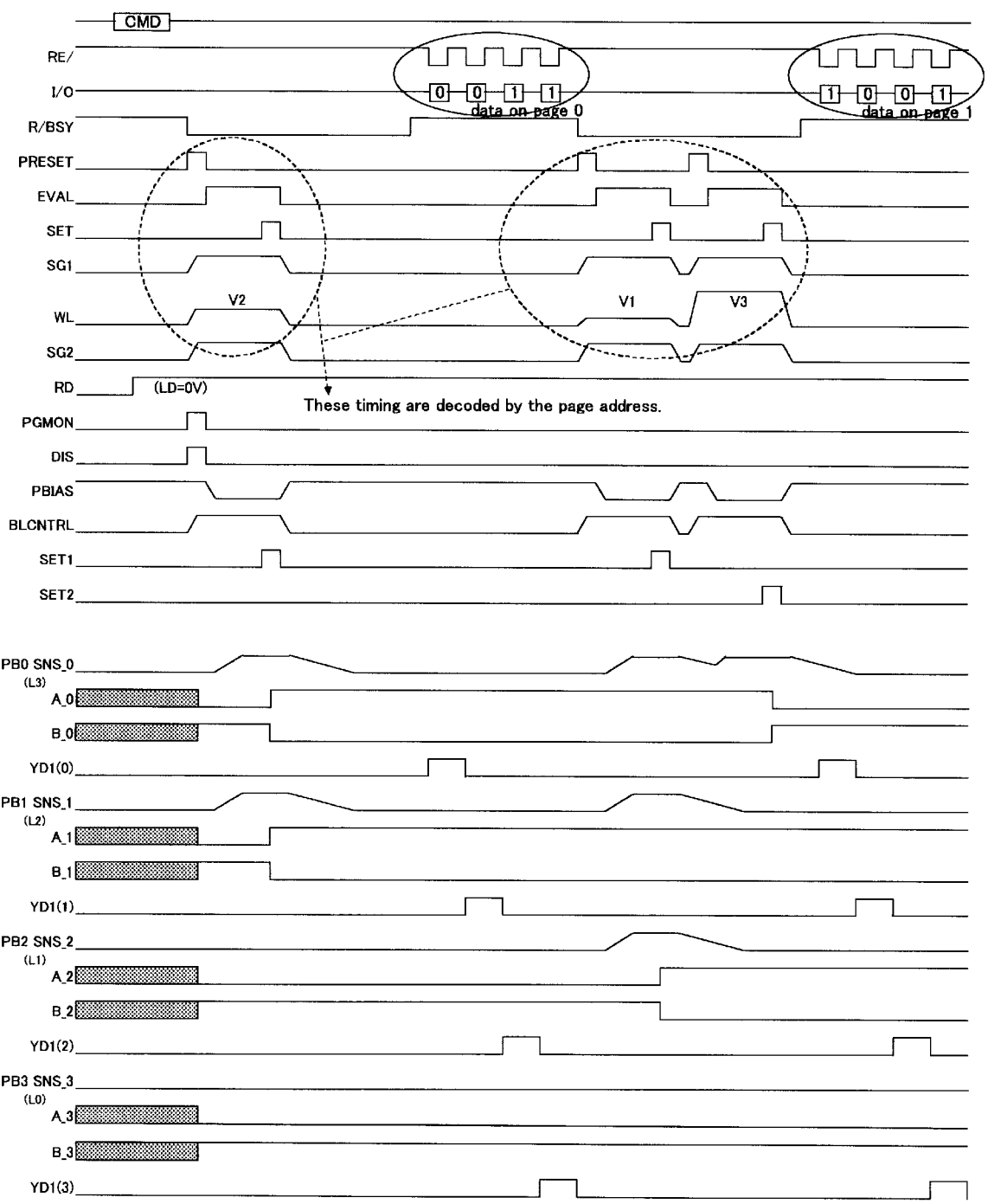
FIG. 7 is a timing chart for the read operation.

FIG. 6 is a table showing each of the signals and node states during a read operation. FIG. 7 is a timing chart for a read operation. In FIG. 6, the stored data, word line WL, set signals SET1 and SET2, latch state, and read data are shown for the four states recorded in memory cells (four combinations of two bits of data). FIG. 7 shows control signals for the page buffer control circuit 12, and signals for the detection node SNS and latch circuit nodes A and B within each page buffer when the flash memory is read.

Accordingly, the operations of the memory cell MC0 and page buffer PB0 are shown in the lines for data Q2=0 and Q1=1 in FIG. 6 and in PB0 of FIG. 7. Likewise, the operations of the memory cell MC1 and page buffer PB1 are shown in the lines for data Q2=0 and Q1=0 in FIG. 6 and in PB1 in FIG. 7. The operations of the memory cell MC2 and page buffer PB2 and the operations of the memory cell MC3 and page buffer PB3 are shown likewise.

A general explanation of the read operations will be given before providing a detailed explanation. The operation in which two-bit memory cell data is read consists of presetting the latch circuit to its initial state, a first cycle in which the first bit Q2 is read, and a second cycle in which the second bit Q1 is read. In the first cycle in which the first bit Q2 is read, the word line WL is driven to the second standard voltage V2. The second cycle in which the second bit Q1 data is read comprises a cycle in which the word line WL is driven to the first standard voltage V1 and a cycle where it is driven to the third standard voltage V3.

In the initial state, the latch circuit LATCH in the page buffer is reset so that the node A moves to the L level and node B to the H level. In the first cycle, the word line WL is driven to the second standard voltage V2. The first latch reversal circuit N17 is activated when the first set signal SET1 is moved to the H level. As a result, the latch state of the latch circuit is reversed or maintained in accordance with the memory cell state. Specifically, in states L2 and L3, the detection node SNS is on the H level and the latch circuit is reversed.

In the second cycle, when the word line WL is driven to the first standard voltage V1, the first set signal SET1 is again moved to the H level and the first latch reversal circuit N17 is activated. In state L1, the detection node SNS moves to the H level and the latch circuit is reversed. Furthermore, when the word line WL is then driven to the third standard voltage V3, the second set signal SET2 moves to the H level and in state L3 the detection node SNS moves to the H level and the latch circuit is reversed. As a result, in the second cycle, data is latched to the latch circuit in accordance with the second bit Q1.

In both the first and second cycles, data in the latch circuit LATCH is sent from the page buffer PB to the input-output buffer IOB.

The read operation will now be explained in detail with reference to FIG. 6 and FIG. 7. In response to a read command, the main control circuit 10 outputs a preset signal PRESET. In response to this, the page buffer control circuit 12 causes the program on signal PGMON and the discharge signal DIS to move to the H level and node A of the latch circuit LATCH to be reset to the L level via transistors N13 and N11. Accordingly, in the initial state of the latch circuit, node A is on the L level and node B is on the H level.

In the first cycle, the word driver, which is not shown in the diagram, causes the word line WL to be driven to the second standard voltage V2 and the segment signals SG1 and SG2 are also driven to the H level. The time for which the word line WL is driven is controlled by the control signal EVAL from the main control circuit 10. At the same time, the bit line control signal BLCNTRL moves to the H level, the transistor N10 becomes conductive, and the bit line BL is connected to the page buffer PB. Also, when the bias control signal PBIAS moves to the L level, transistor P12 becomes conductive and supplies an electrical current to the bit line BL.

Memory cells MC3 and MC2 in states L0 and L1 (Q2=1) become conductive when the word line WL is V2. The bit line current is absorbed into the memory cells and detection nodes SNS3 and SNS2 move to the L level. In contrast, memory cells MC1 and MC0 in states L2 and L3 (Q2=0,) are not conductive when the word line WL is V2 and detection nodes SNS1 and SNS 0 move to the H level. Then, in response to the set signal SET from the main control circuit 10, the page buffer control circuit 12 moves the first set signal SET1 to the H level. The transistor N17, which is part of the first latch reversal circuit, is thereby activated. Transistor N17 is only conductive for memory cells MC1 and MC0 in states L2 and L3 (Q2=0). It reverses the state of the latch circuit LATCH and moves node A to level H and node B to level L. That is, as shown in FIG. 7, the latch circuits of page buffer PB0 and PB1 are reversed and the latch circuits of page buffer PB2 and PB3 are maintained in their original state.

Continuous changing of internal addresses in synchronized with the read-enable clock RE/ enables the selection signals YD1 (0) through YD1 (3) for each page buffer to move to the H level in a time series. The states of the latch circuits in each page buffer are sent via the input-output buffer circuit IOB to the input-output terminal I/O. As shown in FIG. 7, "0011" is output to the terminal I/O as the first data Q2.

Next, the states of the latch circuits within each page buffer circuit are held as they are and the second cycle starts. Firstly, when the word line WL is driven to the first standard voltage V1, as shown in FIG. 7, the detection nodes SNS in page buffers PB0, PB1, and PB2, which are in states L1, L2, and L3, move to the H level. When the first set signal SET1 is moved to the H level, transistors N20, and N17 become conductive. The state of the latch circuit of the page buffer PB2 whose state, in the first cycle, was in its initial state (node A=L, B=H), is reversed.

Furthermore, when the word line WL is driven to the third standard voltage V3 while maintaining the latch state, as shown in FIG. 7, only the detection node SNS0 of the page buffer PB0 moves to the H level. When the second set signal SET2 is next moved to the H level, transistor N18 becomes conductive and the second latch reversal circuit N16 is activated. Node A in the latch circuit within the page buffer PB0 is moved to the L level and reversed.

In this state, nodes A and B are on the L and H levels respectively in a latch circuit within the page buffer PB0 of state L3, on the H and L levels within the page buffer PB1 of state L2, on the H and L levels within the page buffer PB2 of state L1, and on the L and H levels within the page buffer PB3 of state L0. These states are continuously sent to the input-output buffer circuit IOB. In other words, as shown in FIG. 7, data "1001" is sent from the input-output terminal I/O.

As above, the page buffer circuit in this aspect of the embodiment has one latch circuit and after the latch circuit has been preset to its initial state, the first data Q2 is read and latched in the first cycle then is output. Furthermore, the second data Q1 is read and latched in the second cycle by employing the first cycle latch state then is output. Accordingly, the configuration of the page buffer circuit is simple and there is no need for complicated control procedures such as presetting the built-in single latch circuit for each cycle. Therefore, the page buffer circuit in this aspect of the embodiment is effective as a read circuit for a memory cell with a floating gate that records multi-value data.

Figure 8:
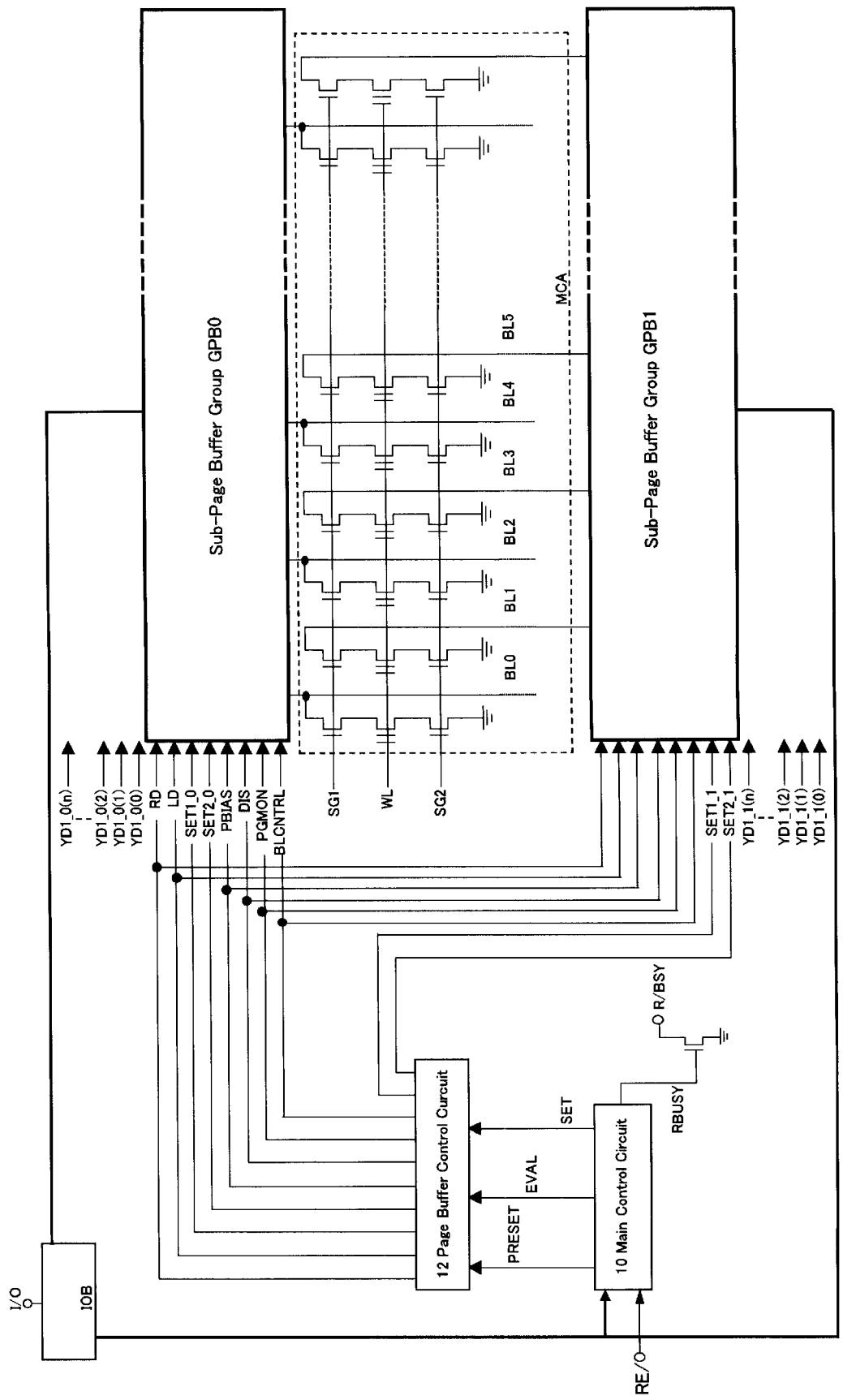
FIG. 8 is another schematic general view of the flash memory.

FIG. 8 is another schematic general view of flash memory. This configuration further improves the performance of the above read operation. As shown in FIG. 7, the first two bits of data are read from the memory cells by reading the first data Q2 from the page buffer PB, storing it in the latch circuit, and serially sending it to the input-output buffer IOB. The second data Q1 is then read from the memory cell, stored in the page buffer, and sent serially to the input-output buffer IOB. That is, while all data in all columns can be read to the page buffer from the memory cell at once, data can only be sent to the input-output buffer IOB from each page buffer in a time series. Accordingly, the greater the number of page buffers PB, the longer the time required for the read operation.

In the flash memory of FIG. 8, the plurality of page buffers is divided into a page buffer group GPB0 connected to even-number bit lines and page buffer group GPB1 connected to odd-number bit lines. Control is set up so that while the data read by one page buffer group is being sent to the input-output buffer circuit IOB, the other page buffer group is reading data from the memory cells. By reading in this way, even when a long time is required for serial data transfer from the plurality of page buffers to the input-output buffer circuit IOB, the time required for reading all the data can be shortened.

Figure 9:
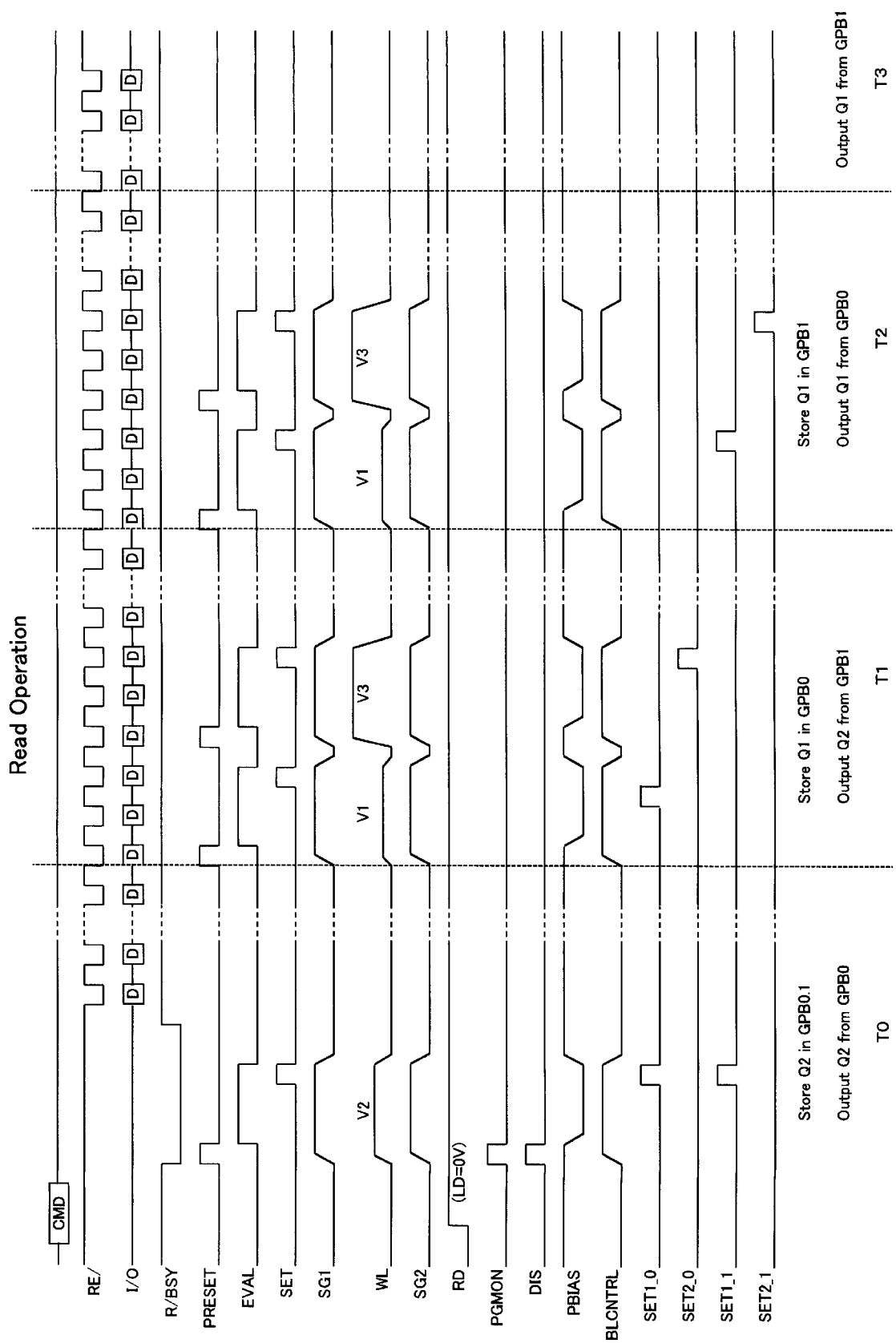
FIG. 9 is a timing chart for the programming operation.

FIG. 9 is a timing chart for the above read operation. During the period T0, the first data Q2 held by the memory cell is read by both page buffer group GPB0 and page buffer group GPB1 and stored in the latch circuit. This operation occurs in the same way as described above. The word line WL is driven to the second standard voltage V2 and the first set signal S1 is moved to the H level and read. Furthermore, during period T0, the first data Q2 that is stored in the first page buffer group GPB0 is sent serially to the input-output buffer circuit IOB.

During the next period T1, the first data Q2 that is stored in the second page buffer group GPB1 is serially sent to the input-output buffer circuit IOB and at the same time the second data Q1 that is held in the memory cells is read in the first page buffer group GPB0 and stored in the latch circuit. These parallel operations reduce the total read time. The reading of the second data Q1, as above, involves the word line WL being driven to the first standard voltage V1 and then the latch circuit being reversed or not reversed by the first set signal SET1. Then, after the word line WL is driven to the third standard voltage V3, the latch circuit is reversed or not reversed by the second set signal SET2.

In the period T2, in contrast to the period T1, when the second data Q1 that is stored in the first page buffer group GPB0 is serially sent to the input-output buffer circuit IOB, the second data Q1 that is held in the memory cells is simultaneously read in the second page buffer group GPB1 and stored in the latch circuit. Here also, the parallel operation reduces the read time. In the last period T3, the second data Q1 that is stored in the second page buffer group GPB1 is serially sent to the input-output buffer circuit IOB.

As described above, when multiple bits of data are held in memory cells, parallel implementation of an operation to read those bits from the memory cells to a page buffer and an operation to serially send those bits from a plurality of page buffers to the input-output buffer circuit, enables the total read operation to be shortened.

Division into sub-buffer groups need not be done on the basis of even- and odd-number bit lines. Also, division into more than two groups is possible. The number of divisions can also be increased in accordance with the number of bits held by memory cells.

Program Operation

Figure 10:
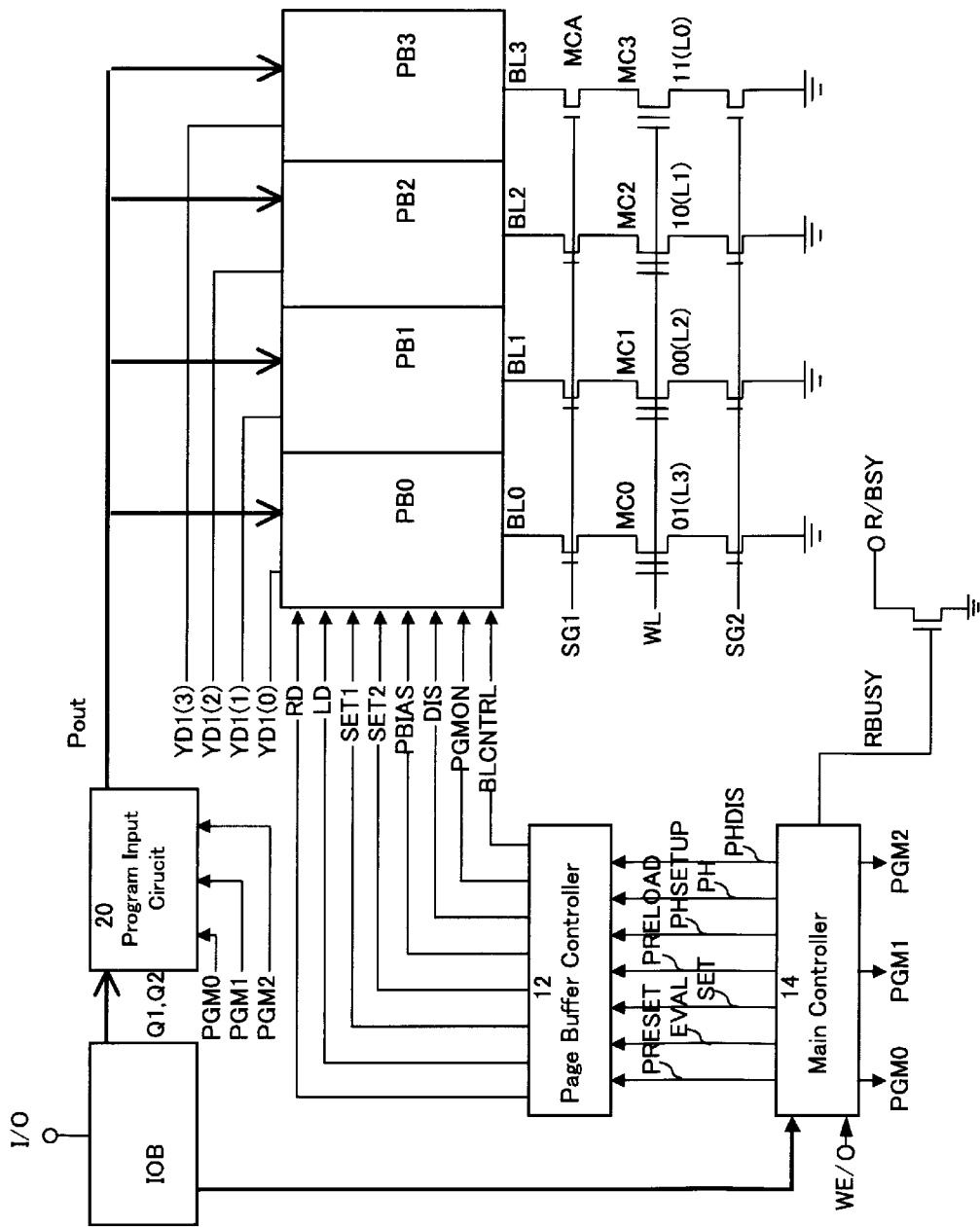
FIG. 10 is a schematic general view of the flash memory for explaining programming operations.
Figure 12:
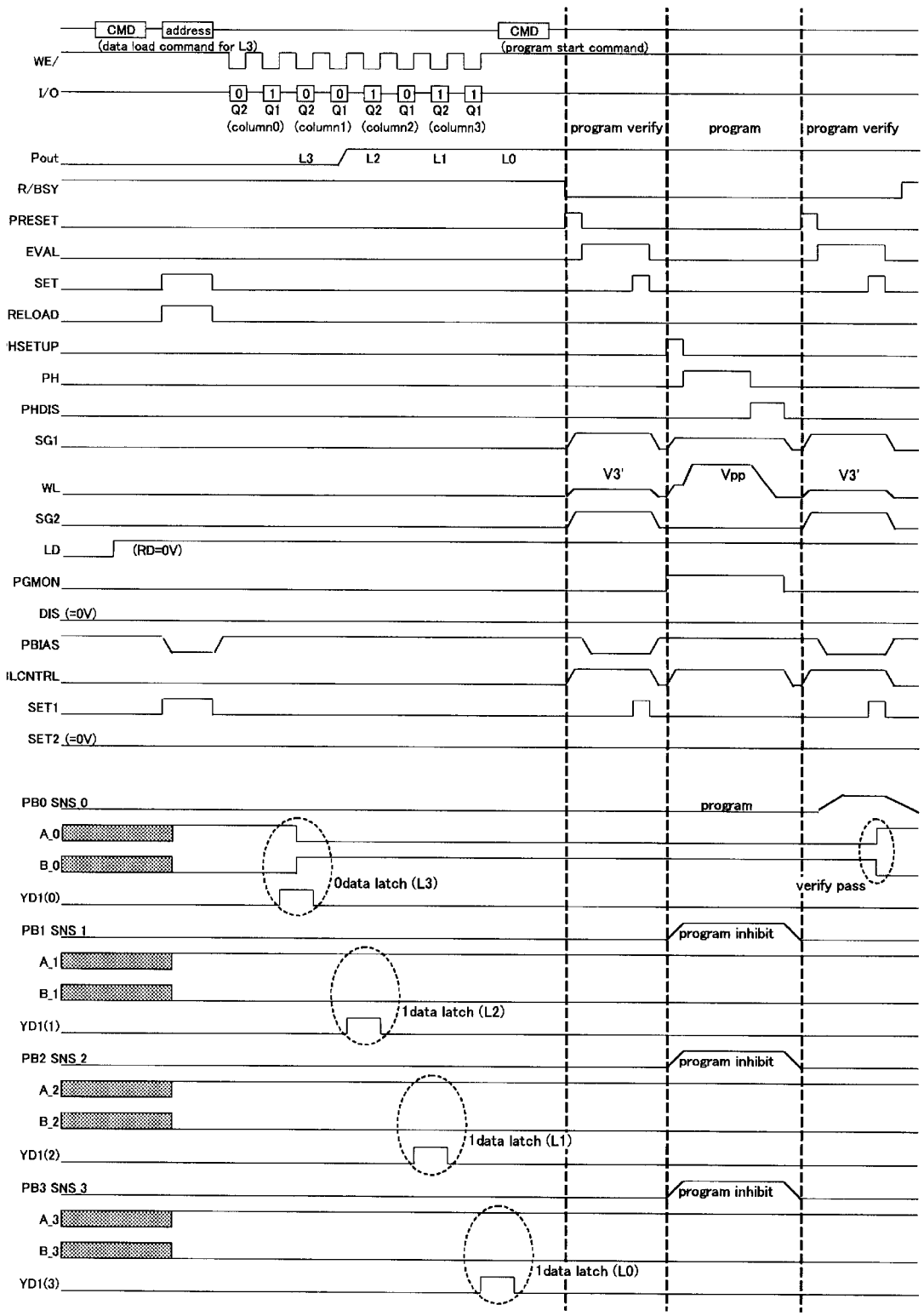
FIG. 12 is a timing chart for the operation for programming to state L3.
Figure 13:
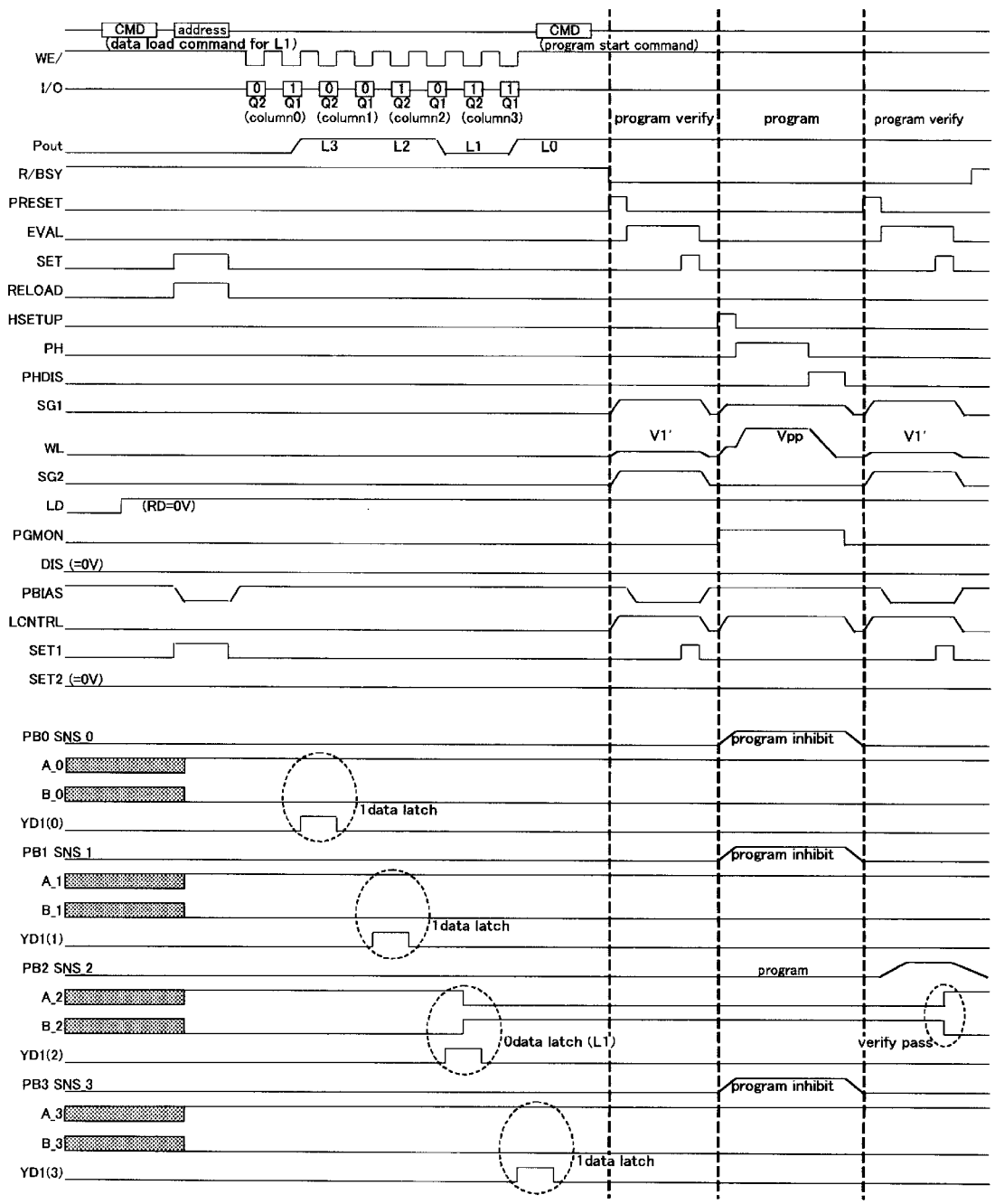
FIG. 13 is a timing chart for the operation for programming to state L1.
Figure 14:
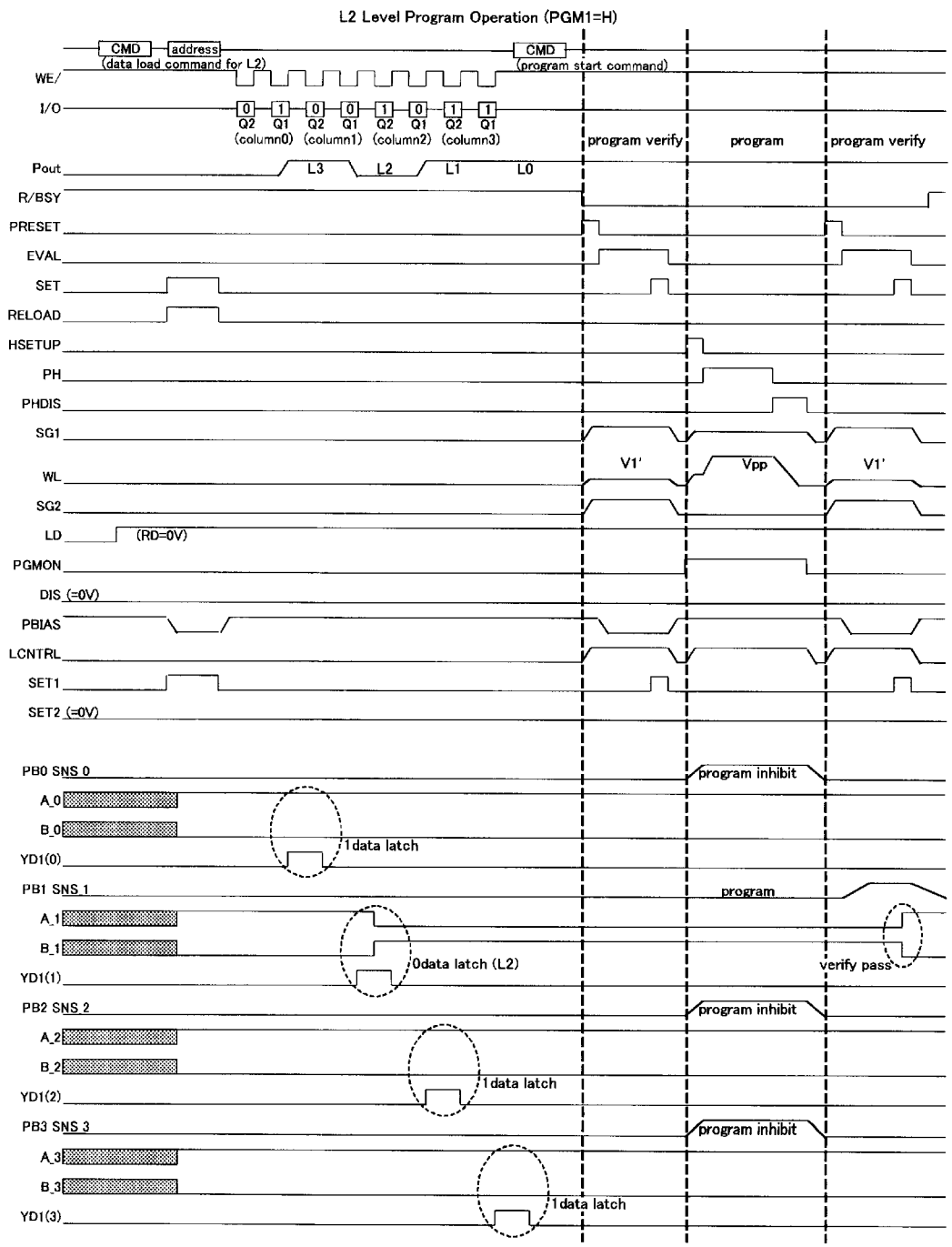
FIG. 14 is a timing chart for the operation for programming to state L2.

Program operation of the flash memory containing the memory cells that hold two bits of data will be explained next. FIG. 10 is a schematic general view of the flash memory for explaining the program operation. FIGS. 11A–D is a diagram that explains the program input circuit. FIGS. 12, 13, and 14 are timing charts for program operations. In this aspect of the embodiment, the data shown in all memory cells in FIG. 10 will be programmed as an example. This data is the same as the data held in FIG. 4.

As shown in FIG. 2, the memory cells hold two bits of data and so are programmed in four threshold voltage states, L0 through L3. As with one-bit data, the programming operation involves the erasure of all memory cells and the setting of the threshold voltage to L0. A electrons are then injected into the floating gate in accordance with the two-bit data Q2, Q1 to be programmed and the memory cells are shifted to another threshold voltage state, that is to L1, L2, or L3. Accordingly, the program operation consists of a cycle that shifts the state to threshold level L1, a cycle that shifts it to L2, and a cycle that shifts the state to L3. In all cycles, input of data Q2, Q1 and programming of the corresponding memory cells are carried out. The repetition of verification and injection of electrons in the program operation is the same as the programming of memory cells that hold one-bit data.

In the flash memory shown in FIG. 10, the two bits of data to be programmed, Q2 and Q1, are input serially from the input-output terminal I/O and, the program input circuit sends the program data Pout, which shows whether or not a program exists, to the page buffer PB in accordance with the combination of two-bit data. Accordingly, in the example shown in FIG. 10, four sets of data Q2 and Q1 are serially input from the input-output terminal I/O and the corresponding program data Pout is sent serially to four page buffers PB. When the program data Pout is stored in the latch circuits of all page buffers PB, injections of electrons into the floating gates and verify operations are repeated. At this time, electrons are injected into the memory cells that correspond to the page buffers in which the program data Pout showing that a program exists is stored.

In FIG. 10, the main control circuit 10 sends to the page buffer control circuit 12 the preload signal PRELOAD, which resets the page buffers, the program time control signal PH, which controls the length of time for which electrons are injected, the PH setup signal PHSETUP, which controls the setup time during which the bit line reaches the desired level according to the program data, and the discharge control signal PHDIS, which controls the word line discharge after the electrons are injected. The main control circuit 10, also sends to the program input circuit 20, program data control signals PGM0, PGM1, and PGM2, which are all on H level when programmed into states L1, L2, and L3. The three program cycles are controlled by these control signals.

The program input circuit 20 in FIG. 11A comprises an input gate transistor N30, which is controlled by the first write enable signal WE1, a latch circuit 22, inverters 23 and 24, gate transistors N31 through N34, which are controlled by clocks CK1 through 4 generated in accordance with the program data control signals PGM0 through 2, a NOR gate 26, an output gate transistor N35, which is controlled by the second write enable signal WE2, and a latch circuit 27 that holds the program data Pout.

The above clocks CK1 though 4 are generated by the clock generation circuit, which consists of NOR gates 28 and 31 and inverters 29, 30, 32, and 33 in accordance with the program data control signals PGM0–2. FIG. 11C is a table that shows the relationship between the program data control signals PGM0 through 2 and the clocks CK1 through 4 generated by them.

As shown in FIG. 11B, data Q2 and Q1 are alternately and serially input from the input signal Din to the program input circuit 20 in synchronization with the trailing edge of the external write enable signal WE/, and the first and second write enable signals, WE1 and WE2, are output alternately. Accordingly, in the program cycle to state L3 as shown in FIG. 12, data Q2 and Q1 for column 0, data Q2 and Q1 for column 1, data Q2 and Q1 for column 2, and data Q2 and Q1 for column 3 are input serially in synchronization with the write enable signal WE/. The first data to be input, Q2, is latched onto the latch circuit 22 in the program input circuit, and is entered into NOR gate 26 together with the data Q1 to be next latched.

In the L3 level program cycle, the program data control signal PGM2 is controlled at the H level and so clocks CK1 through 4, as shown in FIG. 11, are controlled in "HLHL" and transistors N31 and N33 become conductive. Accordingly, the non-reversal data for data Q2 and the reversal data for data Q1 are input into the NOR gate 26. That is, when the combination Q2=0 and Q1=1, which corresponds to state L3, is entered, the program data Pout moves to the L level. In the L3 program cycle shown in FIG. 12, the program data Pout becomes "LHHH". FIG. 11D shows the program data Pout generated for each column to correspond to the program data signals PGM0 through PGM2. In this chart, "1" and "0"correspond to level H and level L respectively.

As above, the program input circuit 20 generates the program data Pout=L with program for specific combinations of input data Q2 and Q1 using the program data control signals PGM0 through PGM2, which are generated to correspond to the states to be programmed. When the data does not correspond to the particular input data combination, program data Pout=H with non-program is generated. This program data Pout is supplied to all page buffers PB and is stored in the latch circuit LATCH. Then, electrons are injected into the floating gate of the corresponding memory cell in accordance with the stored program data.

Now specific program operations will be explained using FIGS. 12, 13, and 14 for reference. In this aspect of the embodiment, a L3 level program operation is implemented, followed by a L1 level program operation and lastly a state L2 program operation. Note however, that any order can be set for these operations. The following explanation refers to both program and write operations and in both cases the operations involve injection of electrons into the floating gates of memory cells.

The L3 level program operation will be explained using FIG. 12. Firstly, the data to be written is input into NAND-type flash memory. The write data load command that corresponds to state L3 is first input, the program data control signal PGM2 is switched to High to enable loading of the data that corresponds to the L3 state. Next, the start point for the column address into which write data will be loaded is specified. While the address is being specified, the bias control signal PBIAS is set to Low, the first set signal SET1 is set to High, and the latch circuits LATCH for page buffers PB0 through PB3 have nodes A set to High and nodes B set to Low. Next, write data is input according to external control. The data Q2 and Q1 to be recorded into the same memory cell is input continuously in Q2, Q1 order. The data Q2 and Q1 input from the input-output terminal I/O is logically synthesized in the program input circuit 20 shown in FIG. 11. The synthesized data, the program data Pout, is then input into the corresponding page buffer, and then stored in the latch circuit. As shown in FIG. 12, for a L3 level program, a latch circuit is set in each page buffer as follows.

Page buffer PB0: Pout=Low: A_0=Low, B_0=High
Page buffer PB1: Pout=High: A_1=High, B_1=Low
Page buffer PB2: Pout=High: A_2=High, B_2=Low
Page buffer PB3: Pout=High: A_3=High, B_3=Low Here, if node A is low the bit line BL moves to level L and data is written to the corresponding memory cell (electrons are injected). If node A is high, writing of data is inhibited. In the above case, data is written to memory cell MC0, which corresponds to page buffer PB0.

After the write data is input, entry of a write start command corresponding to state L3 starts the write operation in accordance with the write data stored in the latch circuit of the page buffer. In this example, data is written in a write verify, write, write verify . . . (program verify, program, program verify . . . ) sequence. In FIG. 12, for simplicity's sake, it is assumed that sufficient data has been written to the memory cell by the one write operation.

First, write verification takes place. Write verification is done only when node A of the page buffer latch is Low. The verification procedure is substantially the same as for read operations but, in contrast, the page buffer is not set first. A voltage V3' that is slightly higher than the standard voltage V3 is applied to the word line WL. Voltage V3' can be the same as voltage V3, which is applied for read operations, but it can also be different. Normally, V3' is set higher than V3 to place it some margin away from the read state. Write verification occurs before a write operation and so no data is yet written in memory cells. Accordingly, the memory cells are all conductive and the detection node SNS is at level L. Even if a High pulse is applied to the first set signal SET1, therefore, the state of latches in all page buffers will be held.

Next, the write operation is implemented. During a write operation, the program control signal PGMON is set on High. Therefore, the node A of latch circuit LATCH in each page buffer is electrically connected to the bit line BL and writing occurs in accordance with the write data stored in each latch. Therefore, the voltage, or a write inhibit voltage is applied to the bit line BL. The time during which the PH setup control signal PHSETUP is set on High is set so that this bit line BL can be properly charged or discharged. Next, by setting the program time control signal PH on High, a high voltage Vpp is applied to the word line WL. This rising voltage Vpp applies the write stress to the memory cell and is approximately 20 V. Note however, that this voltage depends on the memory cell process parameter and therefore is not necessarily always 20 V. After the voltage Vpp is applied to the word line for a certain length of time, then, the discharge control signal PHDIS will be set on High, and the voltage Vpp that was applied to the word line WL will be discharged.

Next, the write verification cycle starts. The procedure is as explained above. This time, we assume that adequate data has been written in the memory cells and so when a High pulse is applied to the first set signal SET1, the detection node SNS_0 in page buffer PB0 reaches a High level. Accordingly, A_0=High and B_0 is Low in the latch circuit and write verification passes. This completes the write operation. As a result, the write operation is implemented only in memory cell MC0 which is connected to the page buffer PB0 and the memory cell MC0 holds the L3 state.

Next, the L1 level program will be explained using FIG. 13. The procedure for inputting write data is the same as for writing data in the L3 level. Firstly, a write data load command corresponding to L1 is entered, the program data control signal PGM0 set to High, and L1 data place in a load enable state. Next, the start point for the column address in which the write data will be loaded is specified. While this address is being specified, in the latch circuits of all page buffers node A is set to High and node B to Low. Next, as with the level L3 write operation, the four columns of write data Q2 and Q1 are continuously input. Each piece of write data Q2 and Q1 is synthesized in a logical synthesis circuit using the program input circuit 20 and stored in the page buffer corresponding to the output Pout. For the L1 level, each page buffer latch is set as follows.

Page buffer PB0: Pout=High: A_0=High, B_0=Low
Page buffer PB1: Pout=High: A_1=High, B_1=Low
Page buffer PB2: Pout=Low: A_2=Low, B_2=High
Page buffer PB3: Pout=High: A_3=High, B_3=Low Accordingly, write enable data is stored in page buffer PB2 and then data is written to the corresponding memory cell.

Firstly, write verification is implemented. Here verification of level L1 takes place and so a voltage V1' slightly higher than the standard voltage V1 is applied to the word line WL. This write verification takes place before the write operation and so data is not yet written in the memory cells. Even when a High pulse is applied to the first set signal SET1, since the detected level SNS is low, the latches of all page buffers will hold their state.

Next, the write operation is implemented. The voltage Vpp applied to the word line WL applies a write stress to the memory cell and is approximately 17 V. The threshold voltage at the L1 level is low and few electrons are injected. Therefore, the voltage is lower than for the L3 level. Note however, that the same voltage Vpp used for writing at the L3 and L2 levels can be used.

Next, write verification is entered. The procedure is as explained previously. This time it is assumed that adequate data has been written into the memory cells and so when a High pulse is applied to the first set signal SET1, the detection node SNS_2 in the page buffer PB2 will move to the High level. Accordingly, A_2 will be High and B_2 will be low and write verification will pass. This ends the write operation.

Lastly, writing of level L2 will be explained using FIG. 14. The input procedure for write data is the same as for L3 and L1 level writing. Firstly, a write data load command that corresponds to L2 is entered and the program data control signal PGM1 is moved to High to enable L2 data to be loaded. Next, after specifying the start point of the column address into which write data will be loaded, write data Q2 and Q1 are entered in accordance with external control. The page buffer latches are set as follows using logical synthesis of the program input circuit 20.

Page buffer PB0: Pout=High: A_0=High, B_0=Low
Page buffer PB1: Pout=Low: A_1=Low, B_1=High
Page buffer PB2: Pout=High: A_2=High, B_2=Low
Page buffer PB3: Pout=High: A_3=High, B_3=Low Accordingly, data is written into memory cells that correspond to page buffer PB1.

After the write data is input, entry of the write start command that corresponds to L2 starts writing in accordance with the write data stored in the page buffer latch. Firstly, write verification is implemented. Write verification only occurs when node A of the page buffer latch circuit is Low. Here, standard voltage V2', which is slightly higher than standard voltage V2 is applied to the word line WL. Voltage V2' can be the same as voltage V2, which is used during a read operation, or it may be different. Normally, V2' is set so that V3>V2'>V2. This ensures that a margin is maintained from the read state. Here in write verification, since the memory cell is not programmed yet, the page buffer latch circuit maintains its state.

Next, the write operation is implemented. By changing the program period control signal PH to High, the rising voltage vpp applied to the word line is approximately 18 V. It is preferable that this voltage is lower than that for L3 but higher than that for L1. Note however that this voltage can be the same as the rising voltage vpp used in writing at other Vt levels.

Next, write verification is implemented. The procedure is as explained previously. Here, it is assumed that sufficient data has been written into the memory cells and so when a High pulse is applied to the first set signal SET1, the detection node SNS_1 in the page buffer PB1 moves to the High level. Accordingly, node A_1 is High and B_1 is Low in the latch circuit and write verification passes. This ends the write operation.

As described above, the program input circuit generates program data that shows whether or not a program exists in accordance with the combination of write data. Accordingly, the program data is stored in one latch circuit within the read buffer circuit and, program operation is implemented according to the program data in all states L1, L2, and L3.

In the above example, when data is input from the outside, data Q2 and Q1, which is not essentially continuous, must be entered as continuous for writing. Except for this point, the page buffers are essentially the same as in single value NAND flash memory, enabling the writing of multi-value data. Also, a method described below can be used to eliminate the demerits of non-continuous data Q2 and Q1 being entered continuously.

FIGS. 15A–C explains another program input circuit. As shown in FIG. 15A, there is a plurality of program input circuits 20 to correspond to the number of page buffers. The collated data Q1 and Q2 to be input is stored into two latch circuits within each program input circuit 20. In other words, as shown in FIG. 15B, each program input circuit is equipped with two latch circuits 22 and 40. The Q1 load signal QLLOAD causes the transistor N41 to become conductive and data Q1 is loaded into latch circuit 40. The Q2 load signal Q2LOAD causes transistor N30 to become conductive and data Q2 is loaded into latch circuit 22. Then, clock signals CK1 through CK4 are generated as shown in the table in FIG. 15C to correspond to the program data control signals PGM0 through PGM2 that are generated in accordance with the levels L0, L1, and L2 to be generated. The program data signal Pout is then output in accordance with the data Q1 and Q2 combination. since latch circuit 40 has been added in the table in FIG. 15C, clock CK3 and CK4 levels are the reverse of those in the table shown in FIG. 11C. Except for this, the operation of the program input circuits is the same as for the circuits described above.

Figure 16:
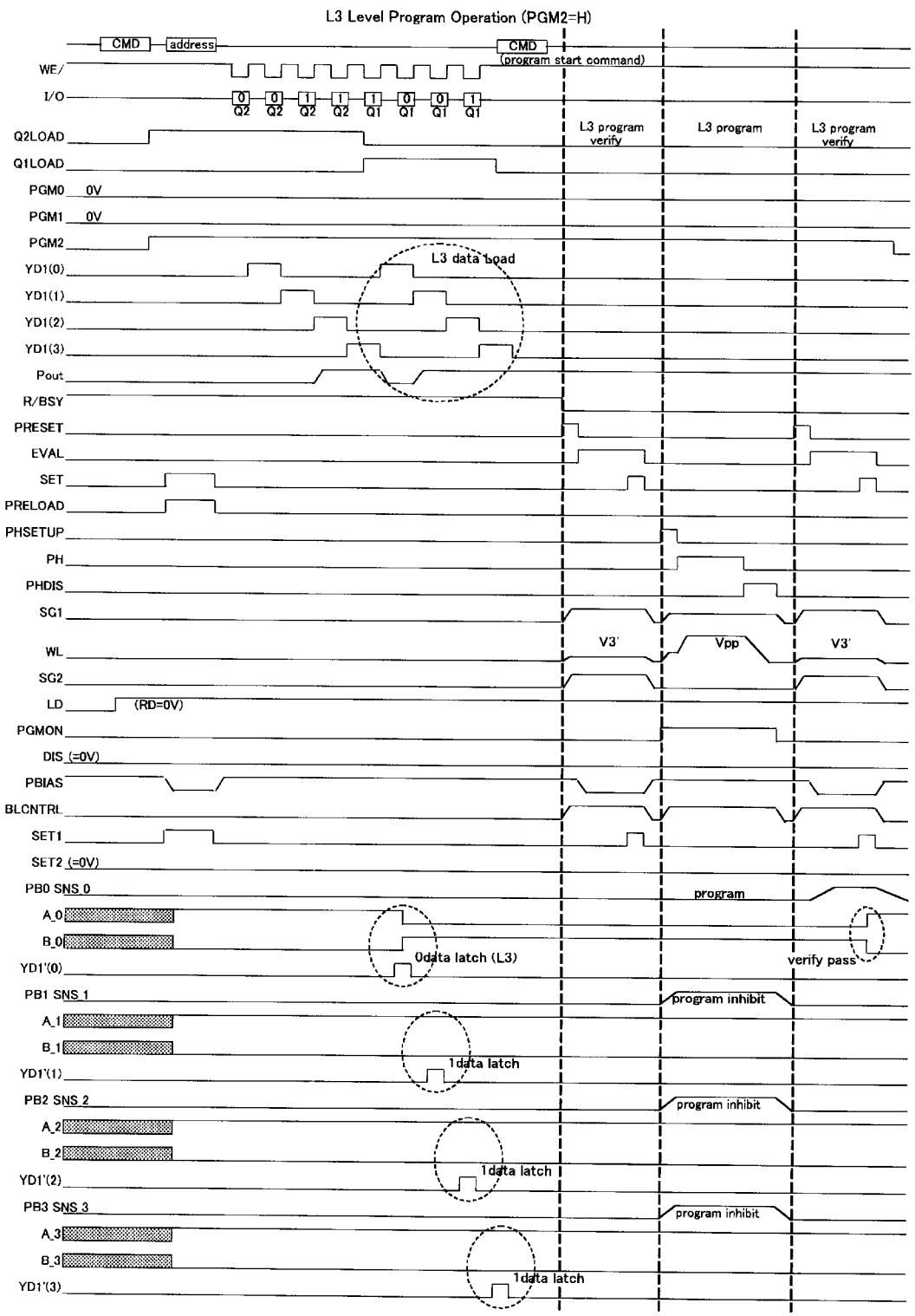
FIG. 16 is a detailed timing chart for a write operation when the program input circuit of FIG. 15 is used.
Figure 17:
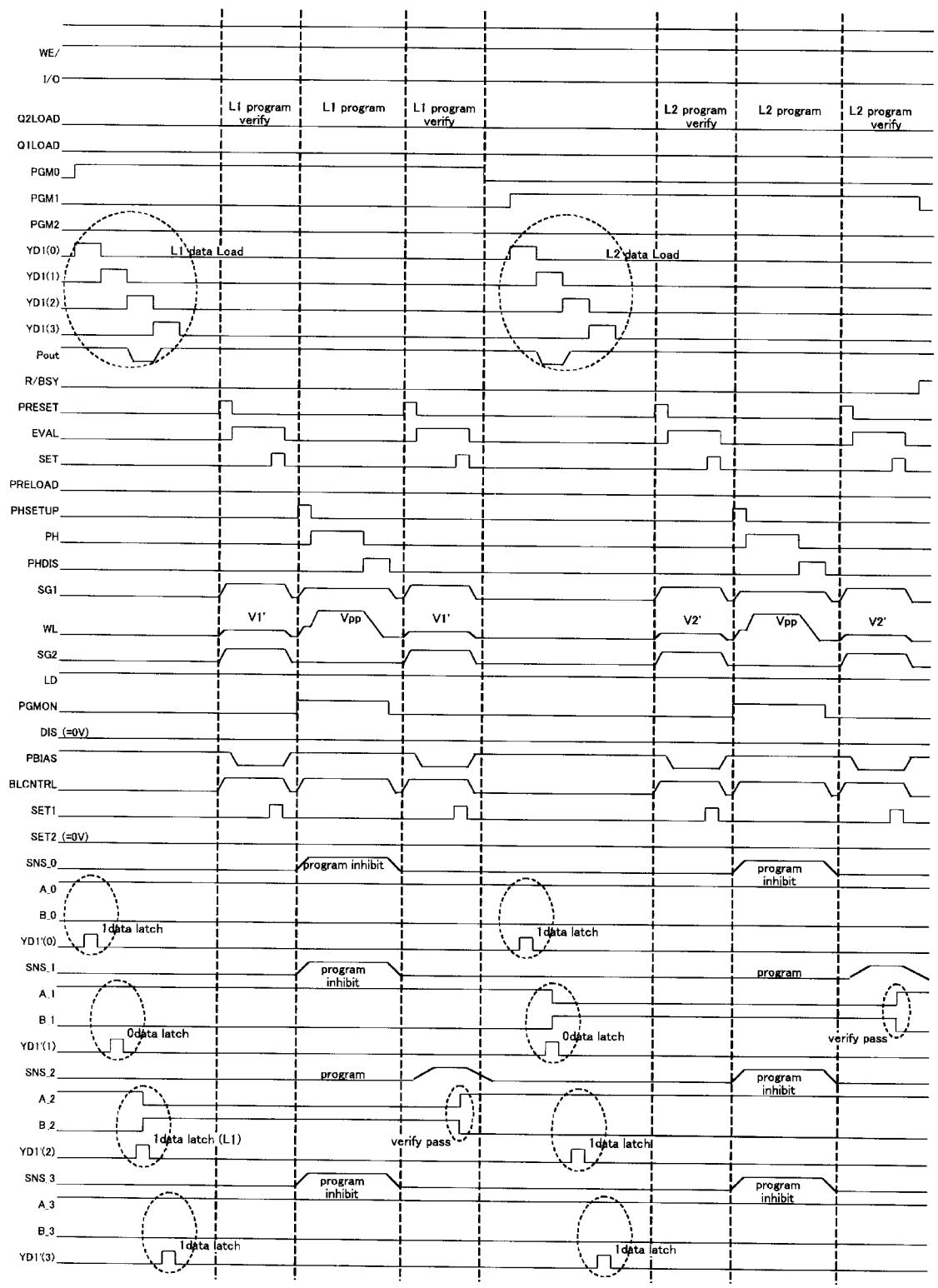
FIG. 17 is a detailed timing chart for a write operation when the program input circuit of FIG. 15 is used.

As explained above, the number of program input circuits 20 is the same as the number of memory cells that can have data written into them at the same time. This means that when write data is entered from an external source, the need for data to be rearranged externally disappears. If write data is entered from the external source in the same order as read data, it can be temporarily stored in the logical synthesis circuit. Later, the write data corresponding to the write level will be automatically logically synthesized within the device and automatically transferred to the page buffer corresponding to the program data Pout, and data will be written at each writing level FIGS. 16 and 17 are detailed write timing charts when program input circuits are used. They differ to FIGS. 12, 13, and 14 above as follows. As shown in FIG. 16, four columns of data Q2 are first entered and stored in the latch circuit 22 of the corresponding program input circuit 20, then four columns of data Q1 are entered and stored in latch circuit 40 in the corresponding program input circuit 20. Afterwards, data is written to the L3, L1, and L2 levels in that order. That is, data Q2 and Q1 do not have to be entered separately for every write operations to each level.

As shown in FIG. 16, when data is written to level L3, the program data control signal PGM2 is set to High and the L level is latched to node A_0 in the latch circuit within the page buffer PB0. The H level is latched to the other nodes, A_1, A_2, and A_3, within the page buffer. Accordingly, in later program operations, electrons are injected only into memory cells that correspond to the page buffer PB0. When the write verification, write operation, and write verification for writing data in level L3 as shown in FIG. 16 occur, operations move to those shown in FIG. 17. The program data control signal PGM0 is set to High and level L1 writing starts. Then, program data control signal PGM1 is set to high and level L2 writing starts. The write verification and write operations are as described above.

Figure 18:
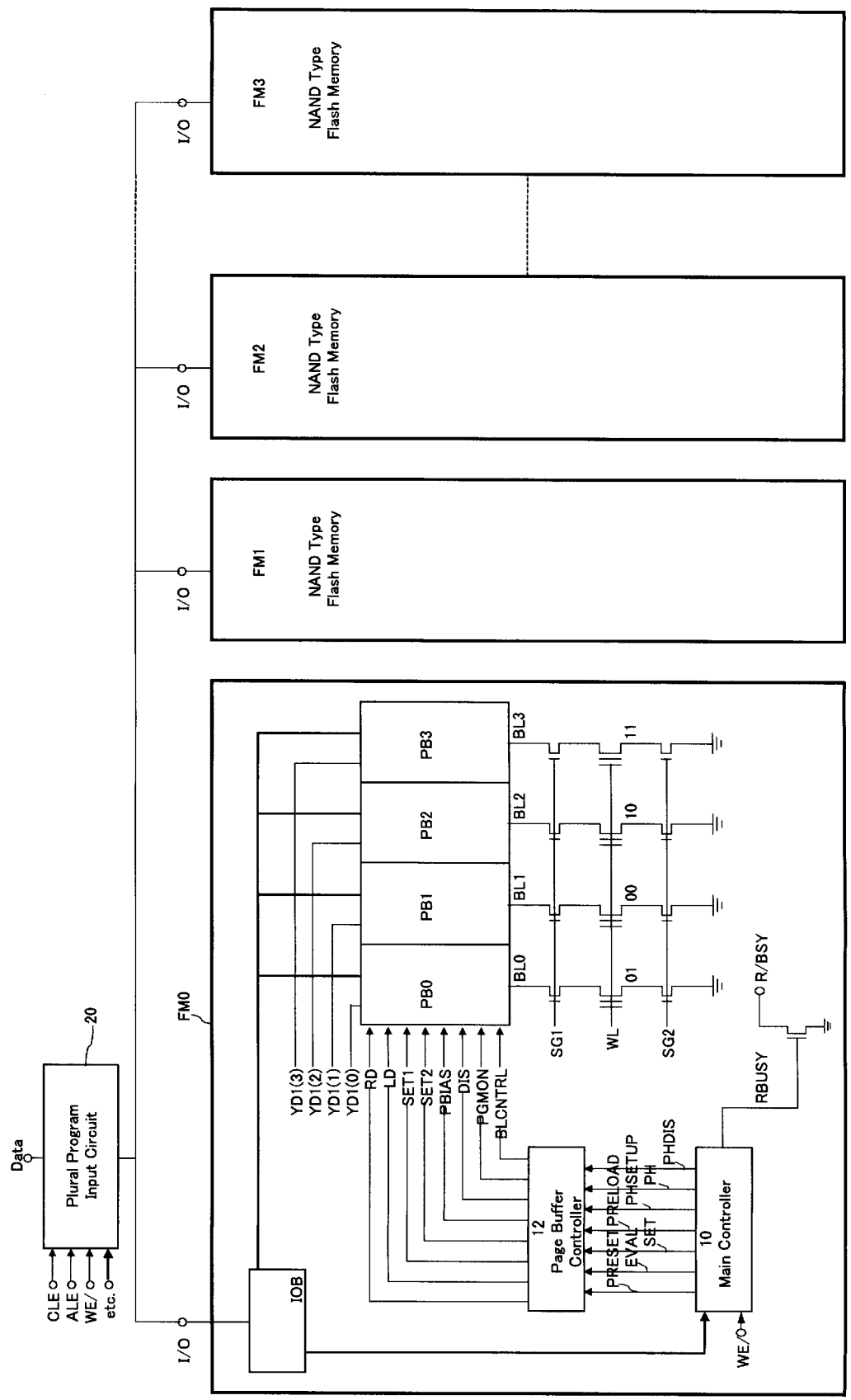
FIG. 18 is a schematic view of a memory device that has a plurality of flash memories.

FIG. 18 is a schematic view of a memory device that has a plurality of flash memories. In the example shown in FIG. 18, a program input circuit 20 is provided as an external circuit for the four flash memory devices, FM0 through FM3. When a plurality of memory devices, for example memory cards, are mounted together, provision of a common program input circuit 20, enables reduction of the sizes of the chips in those flash memory devices. It is preferable that the common program input circuit 20 can store the data Q2 and Q1 for the columns that are simultaneously programmed as shown in FIGS. 15A–C.

As shown above, the present invention enables the provision of a read buffer circuit with a simple circuit configuration in nonvolatile memory that has memory cells for recording multi-bit data. Furthermore, the present invention enables the provision of a program input circuit that, based on the combination of multi-bit data, generates program data showing whether or not a program exists.

The scope of the present invention is not limited to the above aspect of the embodiment but extends to include the invention as described in the claims and any equivalents.

What is claimed is:

1. Nonvolatile memory, comprising:
    a plurality of cell transistors that hold a $2^N$ threshold voltage state ($N \geq 2$);
    a plurality of bit lines and word lines to which said cell transistors are connected; and
    a read buffer circuit, connected to said bit lines, for detecting the threshold voltage state of said cell transistors; and
    wherein said read buffer circuit comprises a latch circuit that latches read data in accordance with said detected threshold voltage state, and a first and second latch reversal circuit that reverse the latch state of said latch circuit into the first and second states;
    wherein when a first bit of data held in said cell transistor is to be read, said read buffer circuit uses said first latch reversal circuit to reverses or not reverse the latch circuit having an initial state in accordance with the detected first and second, or third and fourth threshold voltage state, then outputs the latch state as the first bit of data; and wherein when a second bit of data held by the cell transistor is to be read, said read buffer uses said first latch reversal circuit to reverse or not reverse the latch state corresponding to said first data in accordance with the detected first or second threshold voltage state, then uses said second latch reversal circuit to reverse or not reverse the latch state in accordance with the subsequently detected third or fourth threshold voltage states, and then outputs the latch state as the second bit of data.

2. The nonvolatile memory according to claim 1, wherein said cell transistors have floating gates that accumulate electric charge and control gates that are connected to said word lines;

wherein when said first bit of data is read, the second standard voltage between said first and second threshold voltages and said third and fourth threshold voltages is applied to said word lines; and wherein when said second bit of data is read, the first standard voltage between said first and second threshold voltages is applied to said word lines and then the third standard voltage between said third and fourth threshold voltages is applied to said word lines.

3. The nonvolatile memory according to claim 1, wherein said latch circuit of said read buffer circuit is reset to the initial state prior to said reading operation.

4. The nonvolatile memory according to claim 1, wherein said first latch reversal circuit is activated in response to a first set signal so that said latch circuit is reversed with first node of said latch circuit moved to either the H or L level; and wherein said second latch reversal circuit is activated in response to a second set signal so that said latch circuit is reversed with second node of said latch circuit moved to either the H or L level.

5. The nonvolatile memory according to claim 1, wherein said plurality of bit lines comprises a first bit line group and a second bit line group;

wherein said read buffer circuit further comprises a first read buffer circuit group each read buffer circuit of which is connected to said first bit line group and a second read buffer circuit group each read buffer circuit of which is connected to said second bit line group;

wherein simultaneously as the first data is output from said second read buffer circuit group, said first read buffer circuit group reads and latches the second bit from said cell transistors; and wherein simultaneously as the second data is output from said first read buffer circuit group, said second read buffer circuit group reads and latches the second bit from said cell transistors.

6. The nonvolatile memory according to claim 5, wherein said first and second read buffer circuit groups serially output the read first and second data.

7. Nonvolatile memory, comprising:

a plurality of cell transistors that hold $2^N$ threshold voltage states ($N \geq 2$);

a plurality of bit lines and word lines to which said cell transistors are connected;

a read buffer circuit, connected to said bit lines, for detecting the threshold voltage state of said cell transistors; and a program input circuit that, in response to data input of a first bit and a second bit lower order than the first bit, outputs program data showing whether or not a program exists; and wherein during a programming, said read buffer circuit latches said program data and changes bits lines to state corresponding to the program data, and said program input circuit outputs said program data in accordance with a combination of said first and second bits in a first cycle for programming from a first state, that is a deleted state, to a second state, in a second cycle for programming from the first state to a third state, and in a third cycle for programming from the first state to a fourth state.

8. The nonvolatile memory according to claim 7, wherein said cell transistors comprise a floating gate that accumulates electrical charge and a control gate that is connected to said word lines; and during said programming, in said first cycle an electric charge is applied to said floating gate for cell transistors programmed into said second state, in said second cycle an electric charge is applied to said floating gate for cell transistors programmed into said third state, and in said third cycle an electric charge is applied to said floating gate for cell transistors programmed into said fourth state.

9. The nonvolatile memory according to claim 7, wherein said program input circuit generates said program data by logically synthesizing said first and second bit of data with a program data control signal generated in said first through third cycles.

10. The nonvolatile memory according to claim 7, wherein said program input circuit comprises a data latch circuit that latches said first and second bit of data, so that said program data is generated by logically synthesizing the latched first and second bit of data with a first through third program data control signals generated in said first through third cycles.

11. A nonvolatile memory device, comprising:

a plurality of nonvolatile memories each of which comprises cell transistors holding $2^N$ threshold voltage states ($N \geq 2$), a plurality of bits lines and word lines connected to said cell transistors, and read buffer circuits, connected to said bit lines, for detecting the threshold voltage state in said cell transistor; and a program input circuit that is provided in common for said plurality of nonvolatile memories and that outputs program data showing whether or not a program exists in response to an entry of data of a first bit and a second bit lower order than the first bit; and wherein during a programming, the read buffer circuit within said nonvolatile memory latches said program data and changes the state of the bit lines according to the program data;

and wherein said program input circuit outputs said program data in accordance with a combination of said first and second bit data in a first cycle for programming from a first state, that is a deleted state, to a second state, in a second cycle for programming from the first state to a third state, and in a third cycle for programming from the first state to a fourth state.

* * * * *